US012740048B2

(12) United States Patent
Yoon et al.

(10) Patent No.: US 12,740,048 B2
(45) Date of Patent: Sep. 15, 2026

(54) SEMICONDUCTOR MEMORY DEVICE INCLUDING BURIED GATE PATTERN

(71) Applicant: SAMSUNG ELECTRONICS CO., LTD., Suwon-si (KR)

(72) Inventors: Chan-Sic Yoon, Anyang-si (KR); Kiseok Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 504 days.

(21) Appl. No.: 17/957,242

(22) Filed: Sep. 30, 2022

(65) Prior Publication Data

US 2023/0262961 A1 Aug. 17, 2023

(30) Foreign Application Priority Data

Feb. 17, 2022 (KR) ........................ 10-2022-0021101

(51) Int. Cl.

*H10D 64/27* (2025.01)
*H10B 12/00* (2023.01)
*H10D 84/01* (2025.01)

(52) U.S. Cl.

CPC ........... *H10B 12/34* (2023.02); *H10B 12/053* (2023.02); *H10B 12/09* (2023.02); *H10B 12/50* (2023.02); *H10D 64/513* (2025.01); *H10D 64/514* (2025.01); *H10D 84/0144* (2025.01); *H10B 12/30* (2023.02); *H10D 64/512* (2025.01); *H10D 84/0135* (2025.01)

(58) Field of Classification Search

None

See application file for complete search history.

(56) References Cited

U.S. PATENT DOCUMENTS

| | | | | |
|---|---|---|---|---|
| 6,855,601 | B2 | 2/2005 | Gajda | |
| 8,404,543 | B2 | 3/2013 | Shin et al. | |
| 8,916,438 | B2 | 12/2014 | Lin et al. | |
| 9,379,186 | B1 | 6/2016 | Wang et al. | |
| 9,786,754 | B1 | 10/2017 | Lee et al. | |
| 12,279,445 | B2 * | 4/2025 | Pulugurtha | H10D 30/024 |
| 2006/0270153 | A1 * | 11/2006 | Lee | H10D 30/608 257/E29.267 |
| 2008/0160741 | A1 | 7/2008 | Kang | |
| 2009/0117699 | A1 | 5/2009 | Lin | |
| 2009/0163010 | A1 * | 6/2009 | Oh | H01L 21/76832 438/587 |
| 2013/0228843 | A1 | 9/2013 | Lim et al. | |

(Continued)

FOREIGN PATENT DOCUMENTS

| | | | |
|---|---|---|---|
| KR | 1020060124385 | A | 12/2006 |
| KR | 10-0680965 | B1 | 2/2007 |

(Continued)

*Primary Examiner* — Kretelia Graham
*Assistant Examiner* — William Henry Anderson
(74) *Attorney, Agent, or Firm* — Muir Patent Law, PLLC

(57) ABSTRACT

A semiconductor device includes a substrate having an active region and a gate structure crossing the active region. The gate structure may include a gate pattern penetrating an upper portion of the active region in a first direction perpendicular to a bottom surface of the substrate, a metal-containing pattern on the gate pattern, and a barrier pattern interposed between the gate pattern and the metal-containing pattern and extended to face opposite side surfaces of the metal-containing pattern.

20 Claims, 28 Drawing Sheets

(56) References Cited

U.S. PATENT DOCUMENTS

| | | | | |
|---|---|---|---|---|
| 2017/0317079 | A1* | 11/2017 | Kim | H10D 64/017 |
| 2020/0219898 | A1 | 7/2020 | Kanamori et al. | |
| 2020/0395461 | A1* | 12/2020 | Kim | H01L 21/02321 |
| 2021/0028286 | A1* | 1/2021 | An | H10D 64/685 |
| 2022/0149092 | A1* | 5/2022 | Kang | H10F 39/8063 |
| 2023/0007974 | A1* | 1/2023 | Lee | H10B 12/09 |
| 2023/0083560 | A1* | 3/2023 | Togo | H10D 84/0142 257/330 |

FOREIGN PATENT DOCUMENTS

| | | | |
|---|---|---|---|
| KR | 10-0792394 | B1 | 1/2008 |
| KR | 10-2008-0029661 | A | 4/2008 |
| KR | 20170123378 | A | 11/2017 |
| KR | 1020210011748 | A | 2/2021 |
| KR | 10-2022-0143788 | A | 10/2022 |

* cited by examiner

SEMICONDUCTOR MEMORY DEVICE INCLUDING BURIED GATE PATTERN

CROSS-REFERENCE TO RELATED APPLICATION

This U.S. non-provisional patent application claims priority under 35 U.S.C. § 119 to Korean Patent Application No. 10-2022-0021101, filed on Feb. 17, 2022, in the Korean Intellectual Property Office, the entire contents of which are hereby incorporated by reference.

BACKGROUND

1. Field

The present disclosure relates to a semiconductor device, and in particular, to a semiconductor device including gate structures.

2. Description of the Related Art

Due to their small-size, multifunctionality, and/or low-cost characteristics, semiconductor devices are being esteemed as important elements in the electronics industry. The semiconductor devices are classified into a semiconductor memory device for storing data, a semiconductor logic device for processing data, and a hybrid semiconductor device including both memory and logic elements.

With the recent trend of high speed and low power consumption of electronic devices, semiconductor devices in the electronic devices are also required to have high operating speeds and/or low operating voltages, and in order to satisfy this requirement, it is necessary to increase an integration density of the semiconductor device. However, the increase of the integration density of the semiconductor device may lead to deterioration in reliability and electric characteristics of the semiconductor device. Thus, many studies are being conducted to improve reliability and electric characteristics of the semiconductor device.

SUMMARY

According to an embodiment, a semiconductor device may include a substrate including an active region and a gate structure crossing the active region. The gate structure may include a gate pattern penetrating an upper portion of the active region in a first direction perpendicular to a bottom surface of the substrate, a metal-containing pattern on the gate pattern, and a barrier pattern interposed between the gate pattern and the metal-containing pattern and extended to face opposite side surfaces of the metal-containing pattern.

According to an embodiment, a semiconductor device may include a substrate including active regions, a first gate structure and a second gate structure crossing the active regions, respectively, and a buried semiconductor pattern interposed between the substrate and the second gate structure. Each of the first and second gate structures may include a gate pattern penetrating an upper portion of each of the active regions, a metal-containing pattern on the gate pattern, and a barrier pattern interposed between the gate pattern and the metal-containing pattern and extended to face opposite side surfaces of the metal-containing pattern.

According to an embodiment, a semiconductor device may include a substrate including active regions and a first gate structure and a second gate structure crossing the active regions, respectively. The first gate structure may include a gate pattern penetrating an upper portion of one of the active regions, a metal-containing pattern on the gate pattern, and a barrier pattern interposed between the gate pattern and the metal-containing pattern and extended to face opposite side surfaces of the metal-containing pattern. The second gate structure may include a horizontal gate pattern, a horizontal barrier pattern, and a horizontal metal-containing pattern, which are sequentially stacked on a top surface of another of the active regions.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
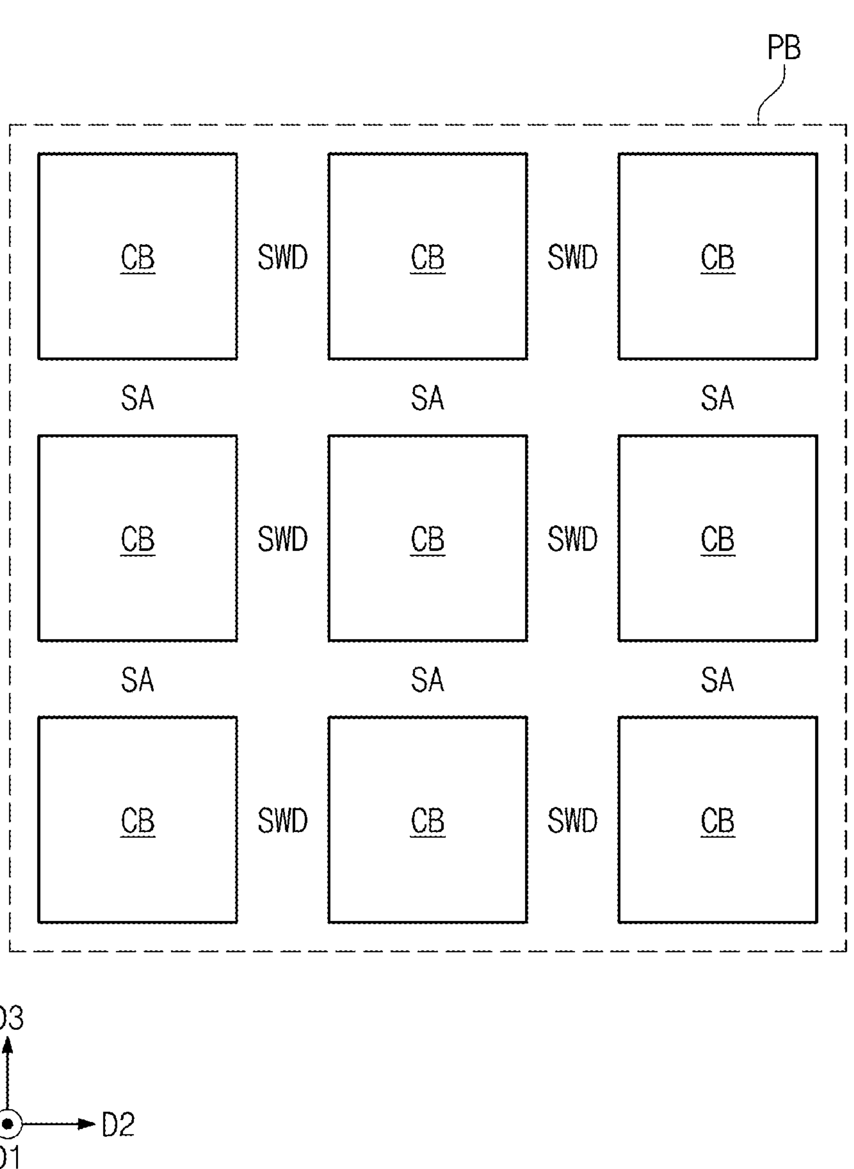
FIG. 1 is a block diagram illustrating a semiconductor device according to an embodiment.

FIG. 1 is a block diagram illustrating a semiconductor device according to an embodiment.

Referring to FIG. 1, a semiconductor device may include cell blocks CB and a peripheral block PB, which is provided to surround each of the cell blocks CB. The semiconductor device may be a memory device, and each of the cell blocks CB may include a cell circuit (e.g., a memory integrated circuit). The peripheral block PB may include various peripheral circuits, which are used to operate the cell circuit, and the peripheral circuits may be electrically connected to the cell circuit.

The peripheral block PB may include sense amplifier circuits SA and sub-word line driver circuits SWD. In an embodiment, the sense amplifier circuits SA may be provided to face each other with the cell blocks CB interposed therebetween, and the sub-word line driver circuits SWD may be provided to face each other with the cell blocks CB interposed therebetween. The peripheral block PB may further include power and ground circuits for driving a sense amplifier.

Figure 2:
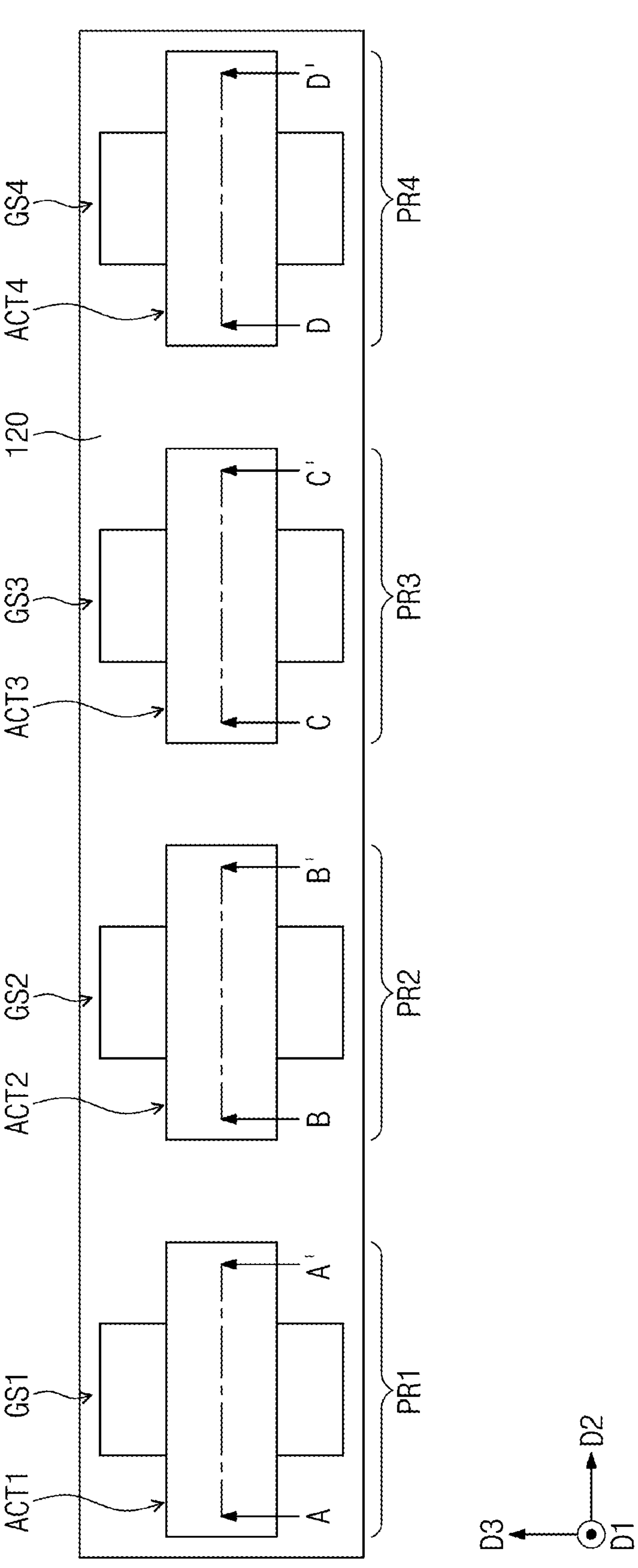
FIG. 2 is a plan view illustrating a semiconductor device according to an embodiment.

FIG. 2 is a plan views illustrating a semiconductor device according to an embodiment. FIGS. 3A to 3D are cross-sectional views along lines A-A' to D-D' of FIG. 2, respectively.

Referring to FIGS. 2 and 3A to 3D, a substrate 100 including a first peripheral region PR1, a second peripheral region PR2, a third peripheral region PR3, and a fourth peripheral region PR4 may be provided. The substrate 100 may be a semiconductor substrate. For example, the substrate 100 may be a silicon substrate, a germanium substrate, or a silicon-germanium substrate. In an embodiment, the substrate 100 may be a silicon-on-insulator (SOI) substrate. The first to fourth peripheral regions PR1, PR2, PR3, and PR4 may be regions of the substrate 100, in which the peripheral block PB of FIG. 1 is provided. For example, as illustrated in FIG. 2, the first to fourth peripheral regions PR1, PR2, PR3, and PR4 may be arranged side by side, e.g., adjacent to each other along the second direction D2.

As further illustrated in FIGS. 2 and 3A to 3D, a first active region ACT1, a second active region ACT2, a third active region ACT3, and a fourth active region ACT4 may be provided on the first peripheral region PR1, the second peripheral region PR2, the third peripheral region PR3, and the fourth peripheral region PR4, respectively. The first to fourth active regions ACT1, ACT2, ACT3, and ACT4 may be protruding portions of the substrate 100, and may extend in the first direction D1 perpendicular to a bottom surface 100*y* of the substrate 100. Thus, a top surface 100*x* of the substrate 100 may correspond to a top surface of the first to fourth active regions ACT1, ACT2, ACT3 and ACT4.

A device isolation layer 120 may be disposed in the substrate 100 to define the first to fourth active regions ACT1, ACT2, ACT3 and ACT4. In an embodiment, the device isolation layer 120 may be formed of or include at least one of, e.g., silicon oxide, silicon nitride, or silicon oxynitride or combination thereof.

Figure 3A:
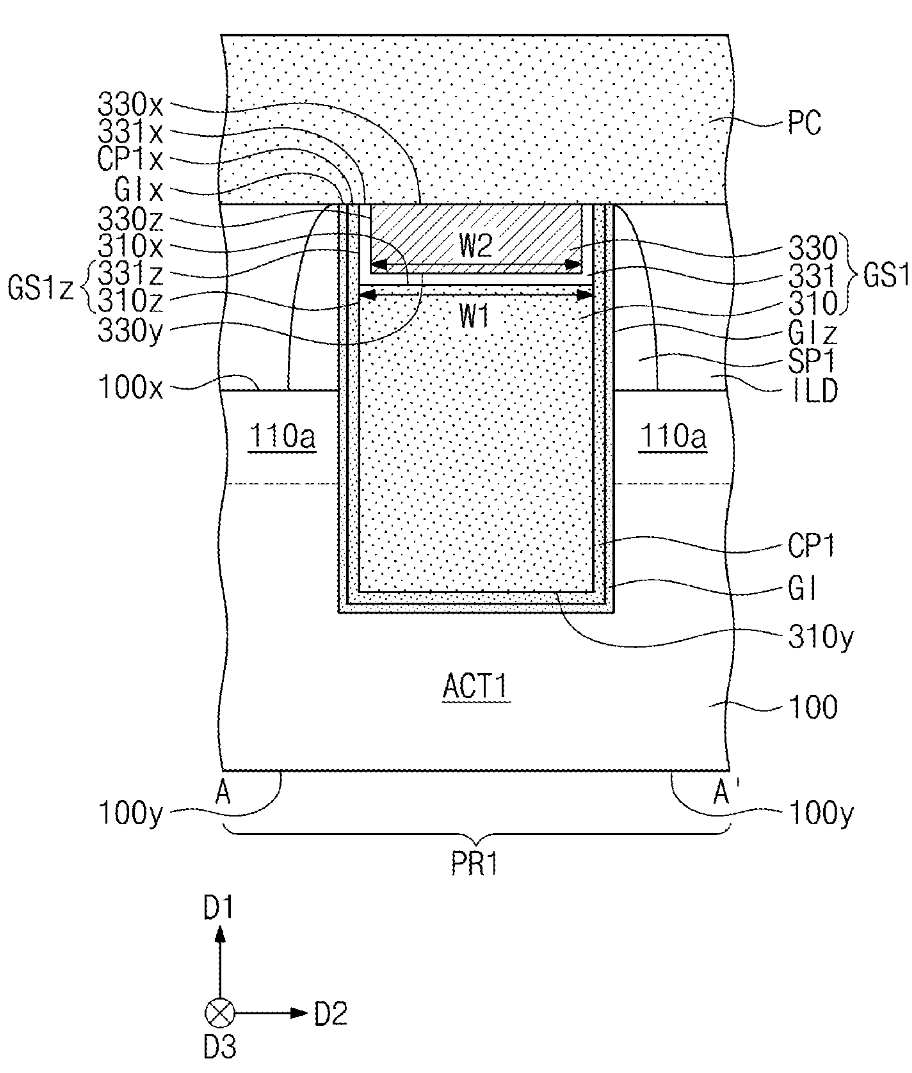
FIGS. 3A to 3D are sectional views along lines A-A' to D-D' of FIG. 2, respectively.

Referring to FIGS. 2 and 3A, a first gate structure GS1 may be provided to cross the first active region ACT1. A lower portion of the first gate structure GS1 may be buried in the substrate 100. The first gate structure GS1 may include a gate pattern 310, a metal-containing pattern 330, and a barrier pattern 331.

The gate pattern 310 may constitute a lower portion of the first gate structure GS1 and may penetrate an upper portion of the first active region ACT1 in the first direction D1. A top surface 310*x* of the gate pattern 310 may be located at a height higher than a top surface of the first active region ACT1, and a bottom surface 310*y* of the gate pattern 310 may be located at a height lower than the top surface of the first active region ACT1, e.g., relative to the bottom surface 100*y* of the substrate 100. The gate pattern 310 may be extended in the second direction D2 and the third direction D3. The second and third directions D2 and D3 may be parallel to the bottom surface 100*y* of the substrate 100 and may be non-parallel (e.g., orthogonal) to each other. The top surface 310*x* of the gate pattern 310 may be parallel to the second and third directions D2 and D3. In other words, the top surface 310*x* of the gate pattern 310 may be substantially parallel to the bottom surface 100*y* of the substrate 100. The gate pattern 310 near, e.g., along, the top surface 310*x* of the gate pattern 310 may have a first width W1 in the second direction D2. In an embodiment, the gate pattern 310 may be formed of or include, e.g., doped or undoped polysilicon.

The metal-containing pattern 330 may be provided on the gate pattern 310. The metal-containing pattern 330 may be provided on the top surface 310*x* of the gate pattern 310. The metal-containing pattern 330 may be extended in the second and third directions D2 and D3. A bottom surface 330*y* of the metal-containing pattern 330 may be parallel to the second and third directions D2 and D3. In other words, the bottom surface 330*y* of the metal-containing pattern 330 may be substantially parallel to the bottom surface 100*y* of the substrate 100. The metal-containing pattern 330 near, e.g., along, the bottom surface 330*y* of the metal-containing pattern 330 may have a second width W2 in the second direction D2. The first width W1 may be larger than the second width W2. In an embodiment, the metal-containing pattern 330 may be formed of or include at least one of metallic materials (e.g., tungsten, titanium, or tantalum).

The barrier pattern 331 may be interposed between the gate pattern 310 and the metal-containing pattern 330. The barrier pattern 331 may be interposed, e.g., directly, between the top surface 310*x* of the gate pattern 310 and the bottom surface 330*y* of the metal-containing pattern 330, and may be extended to face opposite side surfaces 330*z* of the metal-containing pattern 330, e.g., the barrier pattern 331 may extend continuously along opposite side surfaces 330*z* of the metal-containing pattern 330. The barrier pattern 331 may, e.g., completely, cover the bottom surface 330*y* and the opposite side surfaces 330*z* of the metal-containing pattern 330. The topmost surface 331*x* of the barrier pattern 331 may be located at substantially the same height as the top surface 330*x* of the metal-containing pattern 330, and may be coplanar with the top surface 330*x* of the metal-containing pattern 330. Each of opposite side surfaces 331*z* of the barrier pattern 331 may be coplanar with and aligned with a corresponding one of opposite side surfaces 310*z* of the gate pattern 310. In the present specification, the opposite side surfaces 331*z* of the barrier pattern 331 may mean outer side surfaces of the barrier pattern 331. The opposite side surfaces 310*z* of the gate pattern 310 and the opposite side surfaces 331*z* of the barrier pattern 331 may constitute opposite side surfaces GS1*z* of the first gate structure GS1. The barrier pattern 331 may be formed of or include at least one of metal nitride materials (e.g., TiN, TSN, and TaN). For example, a peripheral ohmic pattern may be provided between the barrier pattern 331 and the gate pattern 310, e.g., the peripheral ohmic pattern may be formed of or include at least one of metal silicide materials.

A gate insulating pattern GI may be interposed between the bottom surface 310*y* of the gate pattern 310 and the substrate 100, and may be extended to face the opposite side surfaces 310*z* of the gate pattern 310, e.g., and may extend along opposite side surfaces 310*z* of the gate pattern 310. The gate insulating pattern GI may be further extended to face the opposite side surfaces 331*z* of the barrier pattern 331, and the barrier pattern 331 may be interposed between each of the side surfaces 330*z* of the metal-containing pattern 330 and the gate insulating pattern GI. In other words, the gate insulating pattern GI may be extended to face the opposite side surfaces GS1*z* of the first gate structure GS1. The gate insulating pattern GI may be straightly, e.g., continuously, extended from an inner portion of the first active region ACT1 to a height of the topmost surface 331*x* of the barrier pattern 331 in the first direction D1. The gate insulating pattern GI may be straightly e.g., linearly, extended from a region, which is adjacent to the top surface of the first active region ACT1 (i.e., the top surface 100*x* of the substrate 100), in the first direction D1. Each of opposite side surfaces GIz of the gate insulating pattern GI may have a profile that is linearly extended in the first direction D1. In the present specification, the opposite side surfaces GIz of the gate insulating pattern GI may mean outer side surfaces of the gate insulating pattern GI. The topmost surface GIx of the gate insulating pattern GI may be located at substantially the same height as the top surface 330*x* of the metal-containing pattern 330 and the topmost surface 331*x* of the barrier pattern 331.

The gate insulating pattern GI may be formed of or include at least one of, e.g., high-k dielectric materials. In the present specification, the high-k dielectric material may mean a material having a dielectric constant higher than silicon oxide ($SiO_2$). For example, the high-k dielectric materials may include at least one of hafnium oxide (HfO), hafnium silicate (HfSiO), hafnium oxynitride (HfON), hafnium silicon oxynitride (HfSiON), lanthanum oxide (LaO), lanthanum aluminum oxide (LaAlO), zirconium oxide (ZrO), zirconium silicate (ZrSiO), zirconium oxynitride (ZrON), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), or lead scandium tantalum oxide (PbScTaO) or combination thereof.

A first conductive pattern CP1 may be interposed between the first gate structure GS1 and the gate insulating pattern GI, e.g., the first conductive pattern CP1 may completely separate between the first gate structure GS1 and the gate insulating pattern GI. In an embodiment, the first conductive pattern CP1 may be composed of a single layer. The first conductive pattern CP1 may be formed of or include an n-type work-function metal. In an embodiment, the first conductive pattern CP1 may be formed of or include at least one of, e.g., lanthanum (La), lanthanum oxide (LaO), tantalum (Ta), tantalum nitride (TaN), niobium (Nb), titanium nitride (TiN) or combination thereof. The first conductive pattern CP1 may, e.g., completely, cover the opposite side surfaces 330_z_ of the metal-containing pattern 330. The topmost surface CP1_x_ of the first conductive pattern CP1 may be located at substantially the same height as the topmost surface GIx of the gate insulating pattern GI and may be coplanar with the topmost surface GIx of the gate insulating pattern GI.

A pair of first impurity regions 110_a_ may be disposed adjacent to the opposite side surfaces GS1_z_ of the first gate structure GS1. The pair of first impurity regions 110_a_ may be provided in the first active region ACT1. In an embodiment, the pair of first impurity regions 110_a_ may contain impurities of n-type.

A pair of first spacers SP1 may be disposed on the opposite side surfaces GS1_z_ of the first gate structure GS1. The pair of first spacers SP1 may be disposed on the top surface 100_x_ of the substrate 100. The metal-containing pattern 330, the barrier pattern 331, a portion of the gate insulating pattern GI, and a portion of the first conductive pattern CP1 may be interposed between the pair of first spacers SP1. In an embodiment, each of the first spacers SP1 may be formed of or include at least one of, e.g., silicon nitride, silicon oxide, or silicon oxynitride or combination thereof. In an embodiment, each of the first spacers SP1 may be composed of a single or multiple layer.

An interlayer insulating layer ILD may be provided on the substrate 100. The interlayer insulating layer ILD may cover the pair of first spacers SP1 and the top surface 100_x_ of the substrate 100. In an embodiment, the interlayer insulating layer ILD may be formed of or include at least one of, e.g., silicon nitride, silicon oxide, or silicon oxynitride or combination thereof.

A peripheral capping pattern PC may cover the interlayer insulating layer ILD and the first gate structure GS1. The peripheral capping pattern PC may be formed of or include at least one of, e.g., silicon nitride, silicon oxide, or silicon oxynitride or combination thereof. A plurality of interconnection layers may be provided on the peripheral capping pattern PC, and the interconnection layers may be used as a part of a circuit for driving the semiconductor device.

Figure 3B:
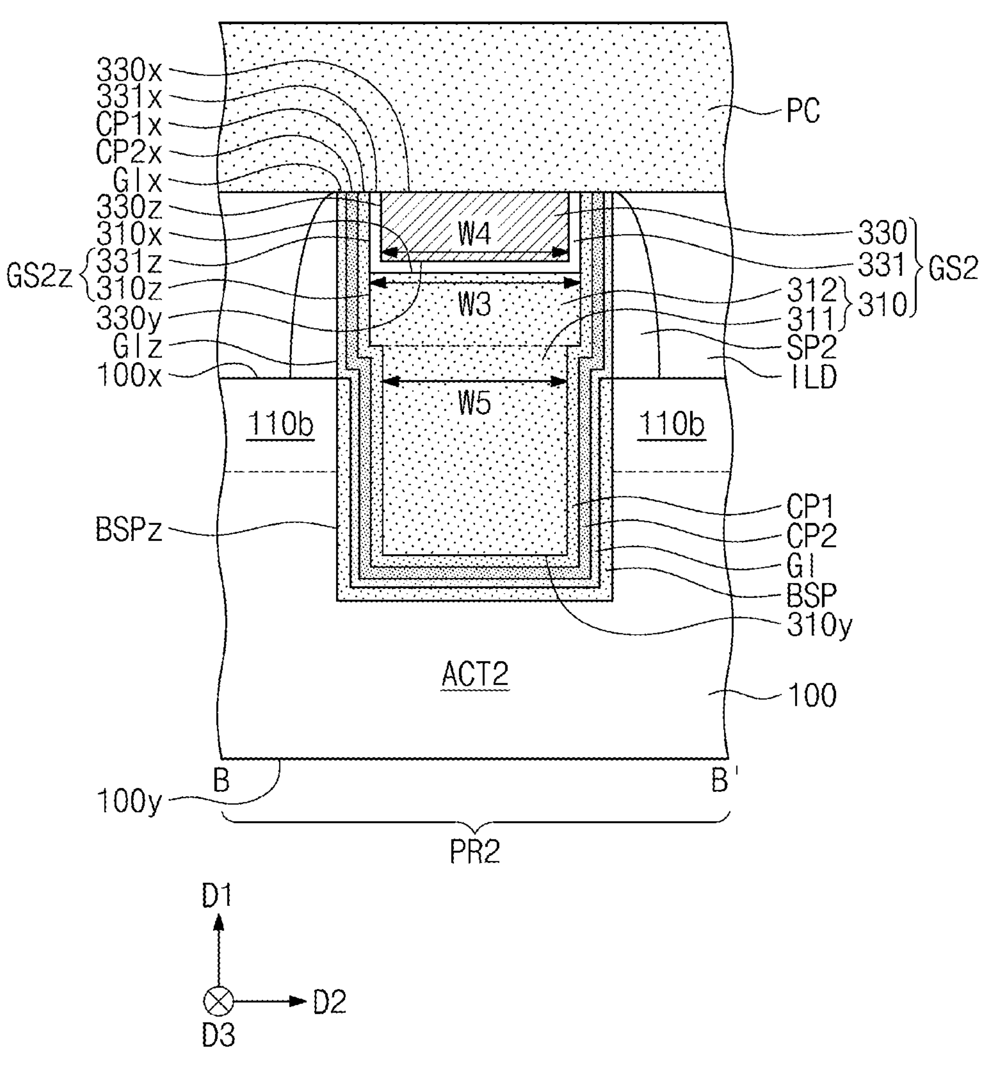

Referring to FIGS. 2 and 3B, a second gate structure GS2 may be provided to cross the second active region ACT2. For concise description, an element described with reference to FIG. 3A may be identified by the same reference number without repeating an overlapping description thereof. The second gate structure GS2 may include the gate pattern 310, the metal-containing pattern 330, and the barrier pattern 331.

The gate pattern 310 may constitute a lower portion of the second gate structure GS2. The gate pattern 310 may include a first portion 311, which is provided to penetrate an upper portion of the second active region ACT2, and a second portion 312, which is provided on the first portion 311 and is extended in the second direction D2. The second portion 312 may protrude from the first portion 311 in the second direction D2 and an opposite direction of the second direction D2, e.g., the second portion 312 may be wider than the first portion 311 in the second direction D2 and may protrude beyond the first portion 311 on both sides of the first portion 311. Accordingly, each of the opposite side surfaces 310_z_ of the gate pattern 310 may have a stepwise profile. The second portion 312 may be located at a height higher than the top surface 100_x_ of the substrate 100, e.g., relative to the bottom surface 100_y_ of the substrate 100. The top surface 310_x_ of the gate pattern 310 may be parallel to the second and third directions D2 and D3.

The gate pattern 310 may have a third width W3 and a fifth width W5. The third width W3 may be a width of the gate pattern 310, which is measured in the second direction D2 near, e.g., along, the top surface 310_x_ of the gate pattern 310. The fifth width W5 may be a width of the gate pattern 310, which is measured in the second direction D2 near, e.g., along, the top surface 100_x_ of the substrate 100. The third width W3 may be larger than the fifth width W5.

The metal-containing pattern 330 may be provided on the gate pattern 310. The metal-containing pattern 330 near, e.g., along, the bottom surface 330_y_ of the metal-containing pattern 330 may have a fourth width W4 in the second direction D2. The third width W3 may be larger than the fourth width W4. The barrier pattern 331 may be interposed between the gate pattern 310 and the metal-containing pattern 330 and may be extended to face the opposite side surfaces 330_z_ of the metal-containing pattern 330.

The gate insulating pattern GI may be interposed between the bottom surface 310_y_ of the gate pattern 310 and the substrate 100 and may be extended to face the opposite side surfaces 310_z_ of the gate pattern 310. In other words, the gate insulating pattern GI on opposite side surfaces of the first and second portions 311 and 312 may be extended in the first direction D1. The gate insulating pattern GI near a boundary between the first and second portions 311 and 312 may be extended along a protruding bottom surface of the second portion 312 and in the second direction D2. Accordingly, the opposite side surfaces GIz of the gate insulating pattern GI may have a stepwise profile. The gate insulating pattern GI may be formed of or include at least one of high-k dielectric materials.

A buried semiconductor pattern BSP may be interposed between the gate insulating pattern GI and the substrate 100. The buried semiconductor pattern BSP may be placed in the substrate 100 to cover the gate insulating pattern GI. The buried semiconductor pattern BSP may be buried in the second active region ACT2. The buried semiconductor pattern BSP in the second active region ACT2 may have opposite side surfaces BSPz, each of which is coplanar with a corresponding one of the opposite side surfaces GIz of the gate insulating pattern GI placed at a height higher than the top surface of the second active region ACT2 (i.e., the top surface 100_x_ of the substrate 100) and is aligned thereto in the first direction D1. In the present embodiment, the opposite side surfaces BSPz of the buried semiconductor pattern BSP mean outer side surfaces of the buried semiconductor pattern BSP (i.e., in contact with the second active region ACT2).

A lattice constant of the buried semiconductor pattern BSP may be larger than a lattice constant of the substrate 100. As an example, the buried semiconductor pattern BSP may be formed of or include silicon germanium.

Conductive patterns CP1 and CP2 may be interposed between the second gate structure GS2 and the gate insulating pattern GI. The conductive patterns CP1 and CP2 may include a first conductive pattern CP1 and a second conductive pattern CP2. The first conductive pattern CP1 may be interposed between the second gate structure GS2 and the gate insulating pattern GI, and the second conductive pattern CP2 may be interposed between the first conductive pattern CP1 and the gate insulating pattern GI. The conductive patterns CP1 and CP2 may be composed of a multiple layer. Opposite side surfaces of the conductive patterns CP1 and CP2 may have a profile corresponding to the opposite side surfaces 310*z* of the gate pattern 310. For example, each of the opposite side surfaces of the conductive patterns CP1 and CP2 may have a stepwise profile, e.g., each of the opposite side surfaces of the conductive patterns CP1 and CP2 may be conformal or trace the stepwise profile of the opposite side surfaces 310*z* of the gate pattern 310. The topmost surface CP2*x* of the second conductive pattern CP2 may be located at substantially the same height as the topmost surface CP1*x* of the first conductive pattern CP1 and may be coplanar with the topmost surface CP1*x* of the first conductive pattern CP1.

The first conductive pattern CP1 may be formed of or include an n-type work-function metal. As an example, the first conductive pattern CP1 may be formed of or include at least one of lanthanum (La), lanthanum oxide (LaO), tantalum (Ta), tantalum nitride (TaN), niobium (Nb), or titanium nitride (TiN) or combination thereof. The second conductive pattern CP2 may be formed of or include a p-type work-function metal. As an example, the second conductive pattern CP2 may be formed of or include at least one of aluminum (Al), aluminum oxide (AlO), titanium nitride (TiN), tungsten nitride (WN), or ruthenium oxide ($RuO_2$) or combination thereof.

A pair of second impurity regions 110*b* may be disposed adjacent to opposite side surfaces GS2*z* of the second gate structure GS2. The pair of second impurity regions 110*b* may be provided in the second active region ACT2. The pair of second impurity regions 110*b* may contain impurities that are of a different conductivity type (e.g., p-type) from the first impurity regions 110*a* of FIG. 3A.

A pair of second spacers SP2 may be disposed on the opposite side surfaces GS2*z* of the second gate structure GS2. The pair of second spacers SP2 may be disposed on the top surface 100*x* of the substrate 100. The metal-containing pattern 330, the barrier pattern 331, a portion of the gate insulating pattern GI, a portion of the first conductive pattern CP1, and a portion of the second conductive pattern CP2 may be interposed between the pair of second spacers SP2.

The interlayer insulating layer ILD may be provided on the substrate 100. The interlayer insulating layer ILD may cover the pair of second spacers SP2 and the top surface 100*x* of the substrate 100. The peripheral capping pattern PC may cover the interlayer insulating layer ILD and the second gate structure GS2. A plurality of interconnection layers may be provided on the peripheral capping pattern PC.

Figure 3C:
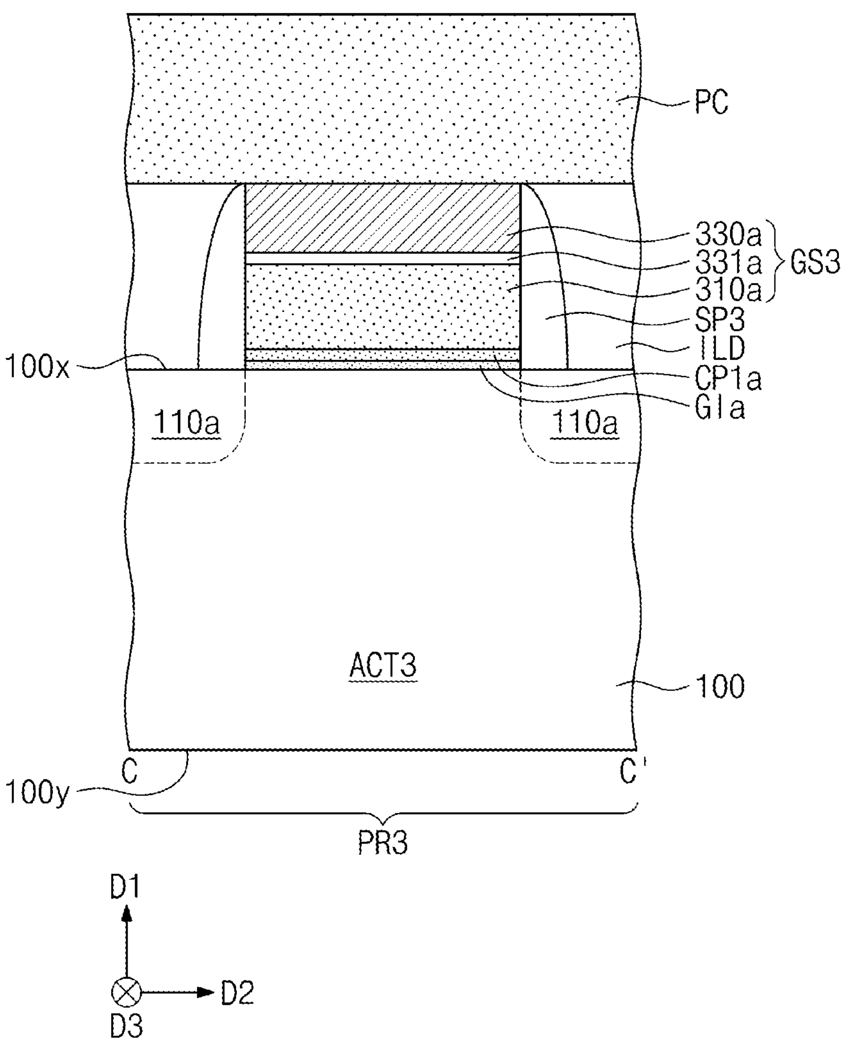

Referring to FIGS. 2 and 3C, a third gate structure GS3 may be provided to cross the third active region ACT3. For concise description, a previously described element may be identified by the same reference number without repeating an overlapping description thereof. The third gate structure GS3 may include a horizontal gate pattern 310*a*, a horizontal barrier pattern 331*a*, and a horizontal metal-containing pattern 330*a*, which are sequentially stacked on a top surface of the third active region ACT3. The horizontal gate pattern 310*a*, the horizontal barrier pattern 331*a*, and the horizontal metal-containing pattern 330*a* may be formed of or include the same materials as the gate pattern 310, the barrier pattern 331, and the metal-containing pattern 330, respectively, of FIG. 3A. A bottom surface of the third gate structure GS3 may be located at a height higher than the bottom surface of the first gate structure GS1 of FIG. 3A, e.g., relative to the bottom surface 100*y* of the substrate 100.

A horizontal gate insulating pattern GIa may be interposed between the third gate structure GS3 and the substrate 100, and a first horizontal conductive pattern CP1*a* may be interposed between the third gate structure GS3 and the horizontal gate insulating pattern GIa. The horizontal gate insulating pattern GIa may be formed of or include, e.g., the same material as the gate insulating pattern GI of FIG. 3A, and the first horizontal conductive pattern CP1*a* may be formed of or include, e.g., the same material as the first conductive pattern CP1 of FIG. 3A.

The pair of first impurity regions 110*a* may be disposed to be adjacent to opposite side surfaces of the third gate structure GS3 and may contain impurities of n-type. A pair of third spacers SP3 may be disposed on the opposite side surfaces of the third gate structure GS3. The interlayer insulating layer ILD may cover the pair of third spacers SP3 and the top surface 100*x* of the substrate 100. The peripheral capping pattern PC may cover the interlayer insulating layer ILD and the third gate structure GS3. A plurality of interconnection layers may be provided on the peripheral capping pattern PC.

Figure 3D:
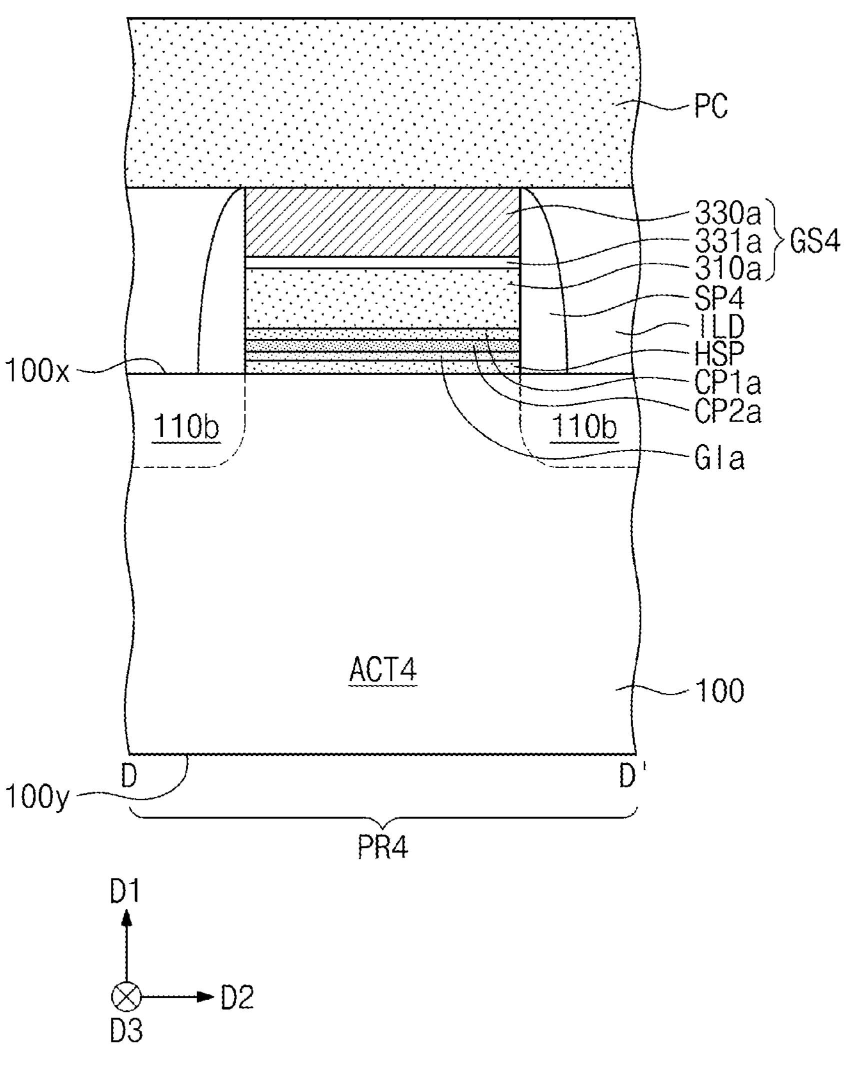

Referring to FIGS. 2 and 3D, a fourth gate structure GS4 may be provided to cross the fourth active region ACT4. For concise description, an element described with reference to FIG. 3C may be identified by the same reference number without repeating an overlapping description thereof. The fourth gate structure GS4 may include the horizontal gate pattern 310*a*, the horizontal barrier pattern 331*a*, and the horizontal metal-containing pattern 330*a*, which are sequentially stacked on a top surface of the fourth active region ACT4. A bottom surface of the fourth gate structure GS4 may be located at a height higher than the bottom surface of the second gate structure GS2 of FIG. 3B, e.g., relative to the bottom surface 100*y* of the substrate 100.

The horizontal gate insulating pattern GIa may be interposed between the fourth gate structure GS4 and the substrate 100, and horizontal conductive patterns CP1*a* and CP2*a* may be interposed between the fourth gate structure GS4 and the horizontal gate insulating pattern GIa. The horizontal conductive patterns CP1*a* and CP2*a* may include the first horizontal conductive pattern CP1*a*, which is provided between the fourth gate structure GS4 and the horizontal gate insulating pattern GIa, and a second horizontal conductive pattern CP2*a*, which is provided between the first horizontal conductive pattern CP1*a* and the horizontal gate insulating pattern GIa. The first and second horizontal conductive patterns CP1*a* and CP2*a* may be formed of or include, e.g., the same materials as the first and second conductive patterns CP1 and CP2, respectively, of FIG. 3B.

The pair of second impurity regions 110*b* may be disposed to be adjacent to opposite side surfaces of the fourth gate structure GS4 and may contain impurities of p-type. A pair of fourth spacers SP4 may be disposed on the opposite side surfaces of the fourth gate structure GS4. The interlayer insulating layer ILD may cover the pair of fourth spacers SP4 and the top surface 100*x* of the substrate 100. The peripheral capping pattern PC may cover the interlayer insulating layer ILD and the fourth gate structure GS4. A plurality of interconnection layers may be provided on the peripheral capping pattern PC.

FIGS. 4A to 11B are cross-sectional views illustrating stages in a method of fabricating a semiconductor device, according to an embodiment. Here, FIGS. 4A to 11A are cross-sectional views, which are taken along line A-A' of FIG. 2, and FIGS. 4B to 11B are cross-sectional views, which are taken along line B-B' of FIG. 2. Hereinafter, a method of fabricating a semiconductor device according to an embodiment will be described in more detail with reference to FIGS. 4A to 11B. For concise description, a previously described element may be identified by the same reference number without repeating an overlapping description thereof.

Figure 4A:
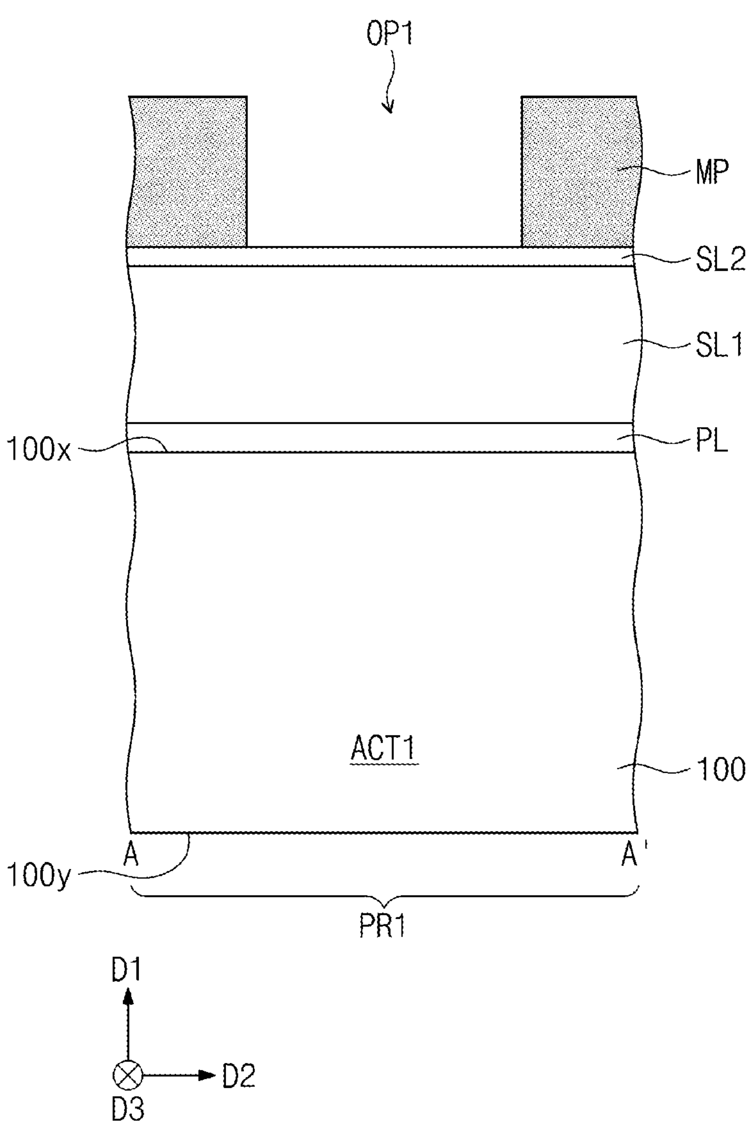
FIGS. 4A-4B, 5A-5B, 6A-6B, 7A-7B, 8A-8B, 9A-9B, 10A-10B, and 11A-11B are sectional views illustrating stages in a method of fabricating a semiconductor device, according to an embodiment.
Figure 4B:
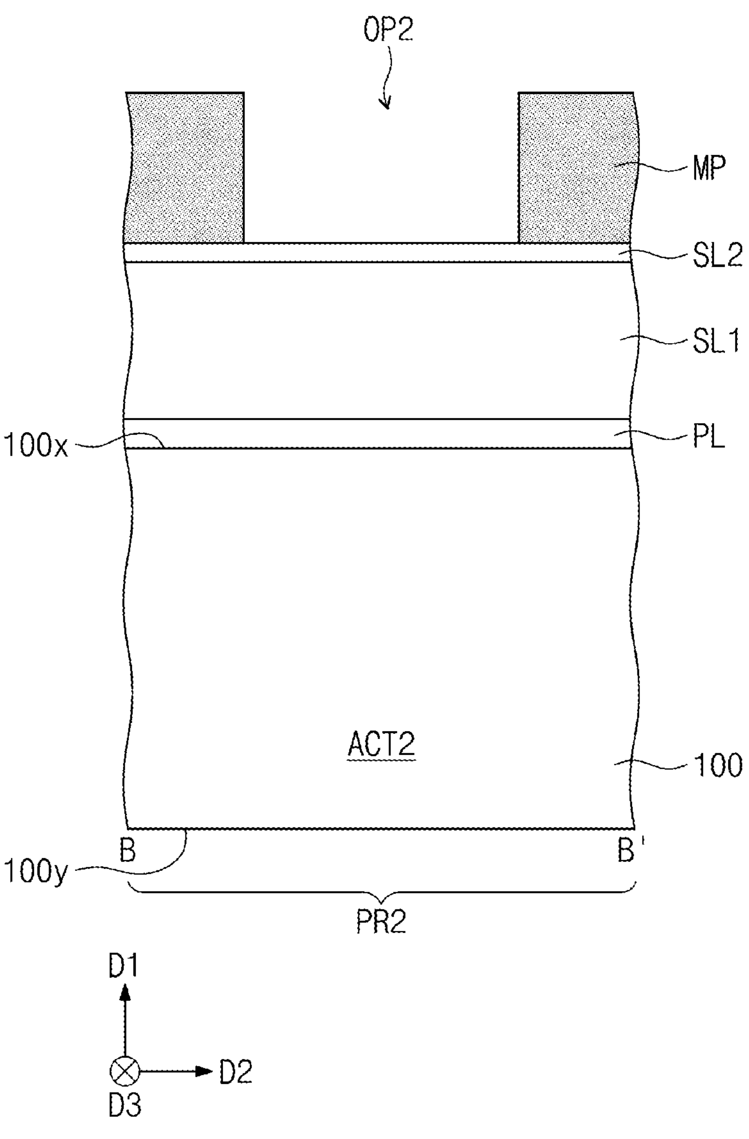

Referring to FIGS. 4A and 4B, the first and second active regions ACT1 and ACT2 may be formed on the first and second peripheral regions PR1 and PR2 of the substrate 100. The formation of the first and second active regions ACT1 and ACT2 may include partially etching an upper portion of the substrate 100 to form a trench region and forming a device isolation layer (e.g., of FIG. 2) to fill the trench region. Some regions of a remaining portion of the substrate 100 may be used as the first and second active regions ACT1 and ACT2.

A protection layer PL, a first sacrificial layer SL1, a second sacrificial layer SL2, and a mask pattern MP may be sequentially formed on the substrate 100. In an embodiment, the protection layer PL may be formed of or include, e.g., at least one of silicon nitride, or silicon oxynitride or combination thereof. The first sacrificial layer SL1 may be formed of or include, e.g., at least one of silicon oxide, or silicon oxynitride or combination thereof. The second sacrificial layer SL2 may be formed of or include, e.g., at least one of silicon oxide, silicon nitride, or silicon oxynitride or combination thereof. The mask pattern MP may include, e.g., a carbon-containing hard mask. However, the materials for the protection layer PL, the first sacrificial layer SL1, the second sacrificial layer SL2, and the mask pattern MP may include may other suitable materials. The formation of the mask pattern MP may include forming a mask layer on the second sacrificial layer SL2 and patterning the mask layer. The mask pattern MP may include a first opening OP1 on the first peripheral region PR1 and a second opening OP2 on the second peripheral region PR2.

Figure 5A:
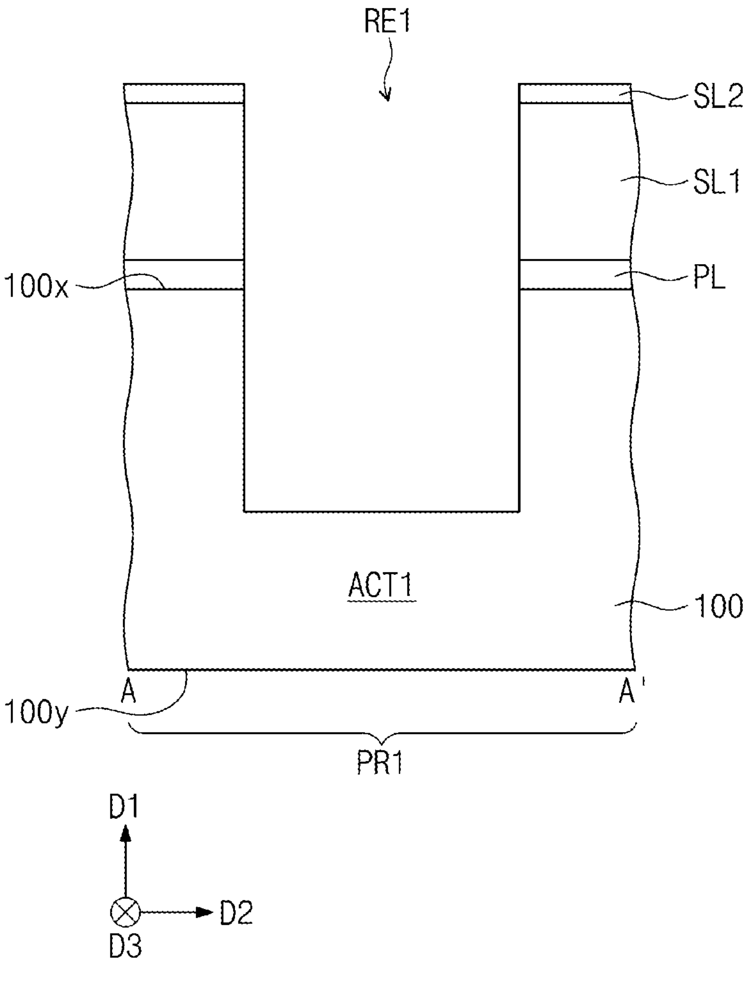
Figure 5B:
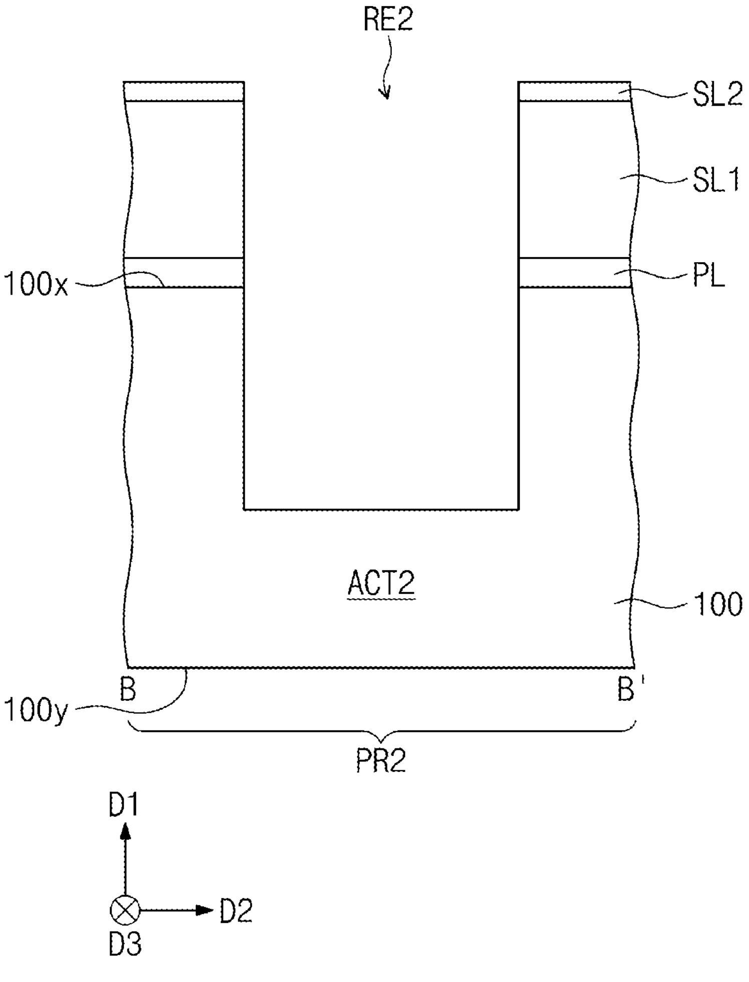

Referring to FIGS. 5A and 5B, first and second recess regions RE1 and RE2 may be formed on the first and second peripheral regions PR1 and PR2, respectively, to penetrate an upper portion of the substrate 100, the protection layer PL, the first sacrificial layer SL1, and the second sacrificial layer SL2. The first and second recess regions RE1 and RE2 may be vertically overlapped with the first and second openings OP1 and OP2 of FIGS. 4A and 4B, respectively. The formation of the first and second recess regions RE1 and RE2 may include performing an anisotropic etching process using the mask pattern MP as an etch mask. The first and second recess regions RE1 and RE2 may be formed to expose an inner portion of the substrate 100. The mask pattern MP may be removed during or after the process of forming the first and second recess regions RE1 and RE2.

Figure 6A:
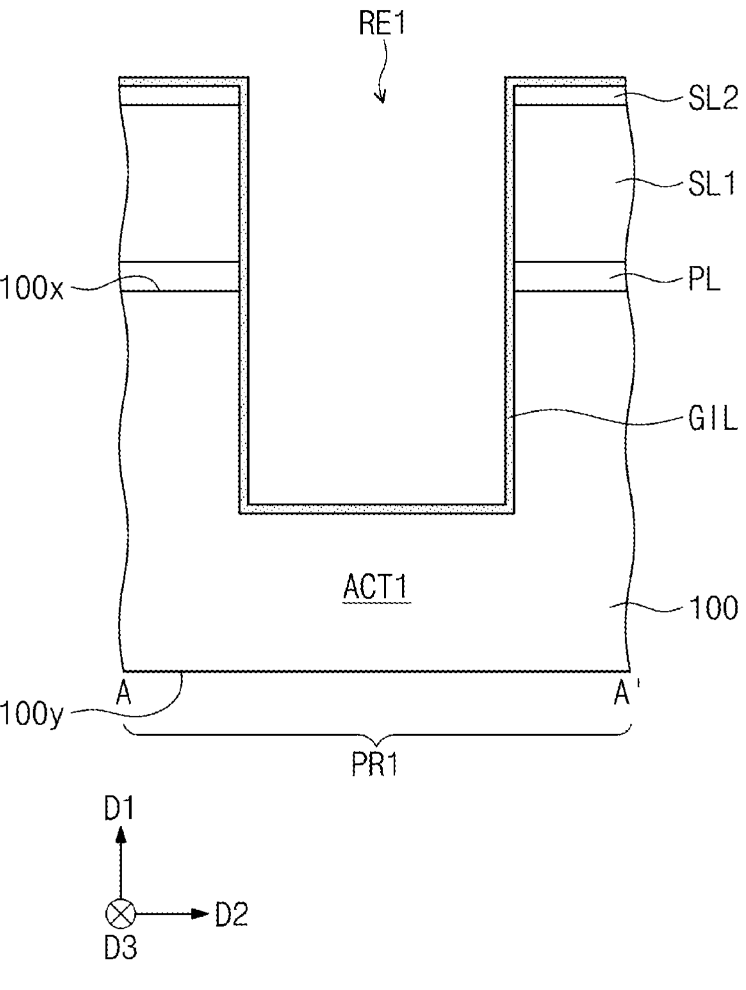
Figure 6B:
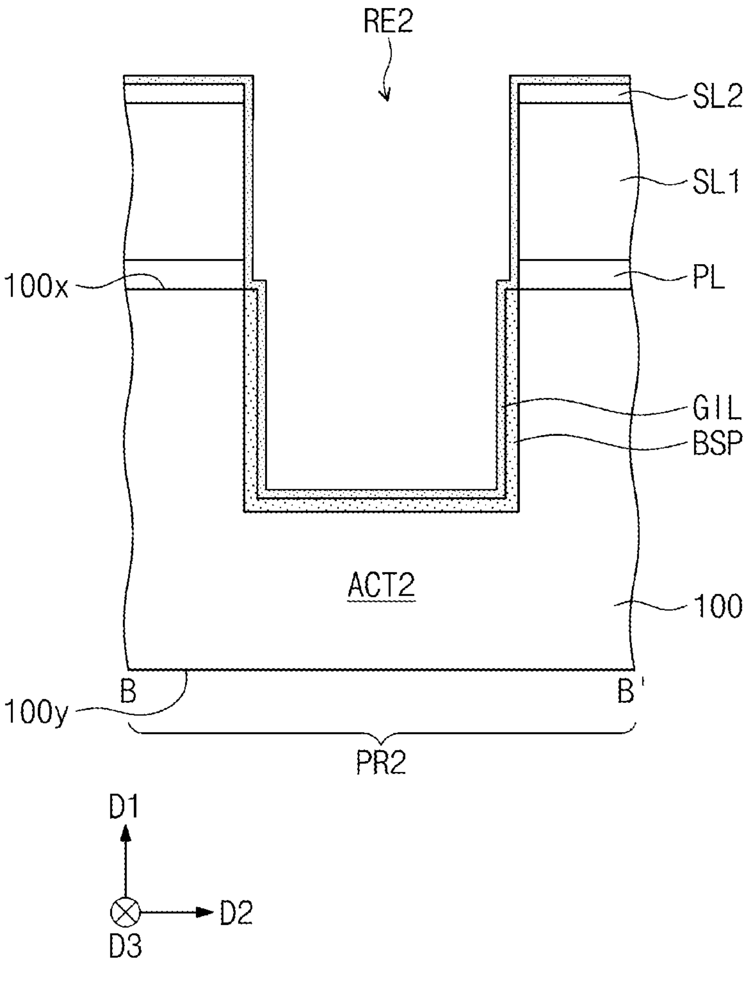

Referring to FIGS. 6A and 6B, the buried semiconductor pattern BSP may be formed in the second recess region RE2. The buried semiconductor pattern BSP may be formed, e.g., conformally, by a selective epitaxial growth (SEG) process, in which the inner portion of the substrate 100 exposed by the second recess region RE2 is used as a seed layer, e.g., so the buried semiconductor pattern BSP may be grown only on the exposed surfaces of the substrate 100. In an embodiment, during the SEG process, an inner portion of the first recess region RE1 may be veiled by an additional mask, and such a mask may be removed after the SEG process.

Thereafter, a gate insulating layer GIL may be formed to conformally cover inner surfaces of the first and second recess regions RE1 and RE2. The gate insulating layer GIL may be extended to face a top surface of the second sacrificial layer SL2. In the second recess region RE2, the gate insulating layer GIL may cover the buried semiconductor pattern BSP. Accordingly, the gate insulating layer GIL on the second peripheral region may have a stepwise profile in a region adjacent to a top surface of the buried semiconductor pattern BSP. The gate insulating layer GIL may be formed of or include, e.g., at least one of high-k dielectric materials. In an embodiment, the gate insulating layer GIL may be formed by an atomic layer deposition (ALD) process.

Figure 7A:
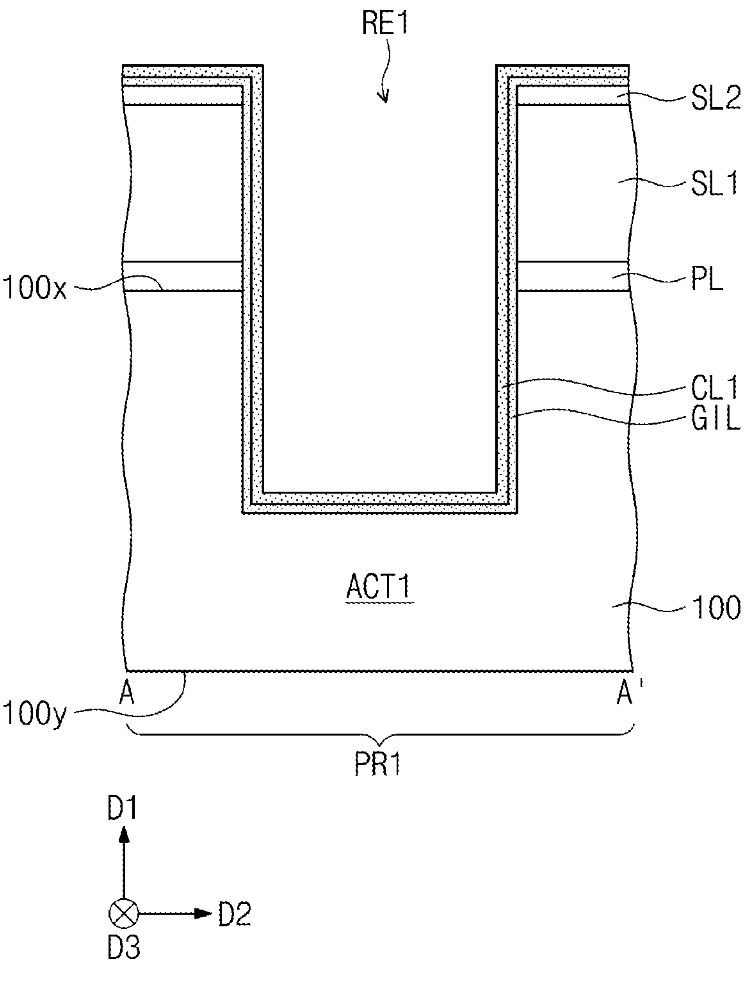
Figure 7B:
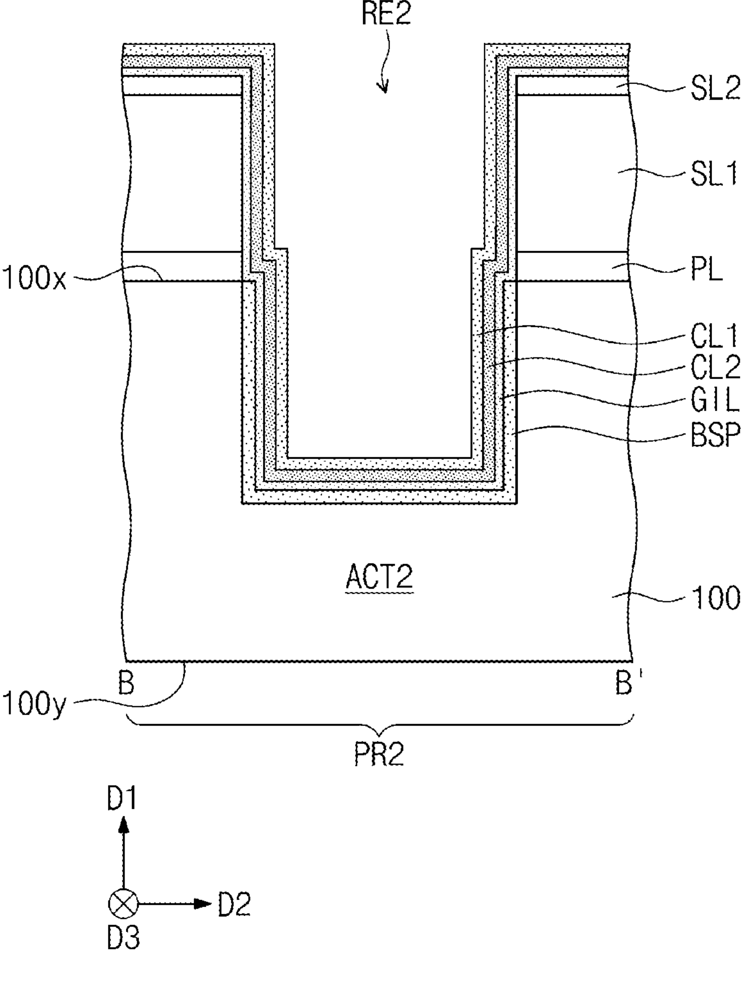

Referring to FIGS. 7A and 7B, a second conductive line CL2 may be formed to conformally cover the gate insulating layer GIL. The second conductive line CL2 may partially fill inner spaces of the first and second recess regions RE1 and RE2 and may be extended to face a top surface of the second sacrificial layer SL2. Thereafter, the second conductive line CL2 may be removed from the first peripheral region PR1. The second conductive line CL2 on the second peripheral region PR2 may have a profile (e.g., a stepwise profile) corresponding to the gate insulating layer GIL.

A first conductive line CL1 may be conformally formed on the entire top surface of the substrate 100. The first conductive line CL1 on the first peripheral region PR1 may conformally cover the gate insulating layer GIL. The first conductive line CL1 on the second peripheral region PR2 may conformally cover the second conductive line CL2. The first conductive line CL1 on the second peripheral region PR2 may have a profile (e.g., a stepwise profile) corresponding to the second conductive line CL2. The first conductive line CL1 may be formed of or include, e.g., an n-type work-function metal, and the second conductive line CL2 may be formed of or include, e.g., a p-type work-function metal.

Figure 8A:
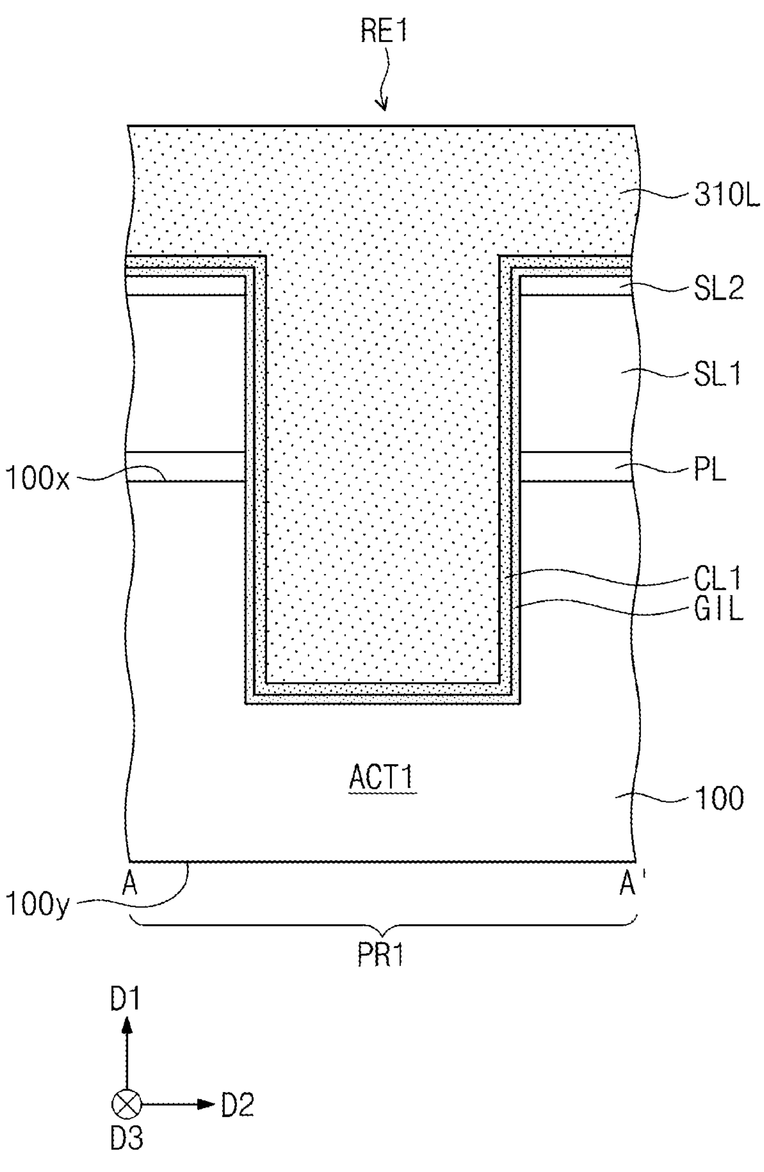
Figure 8B:
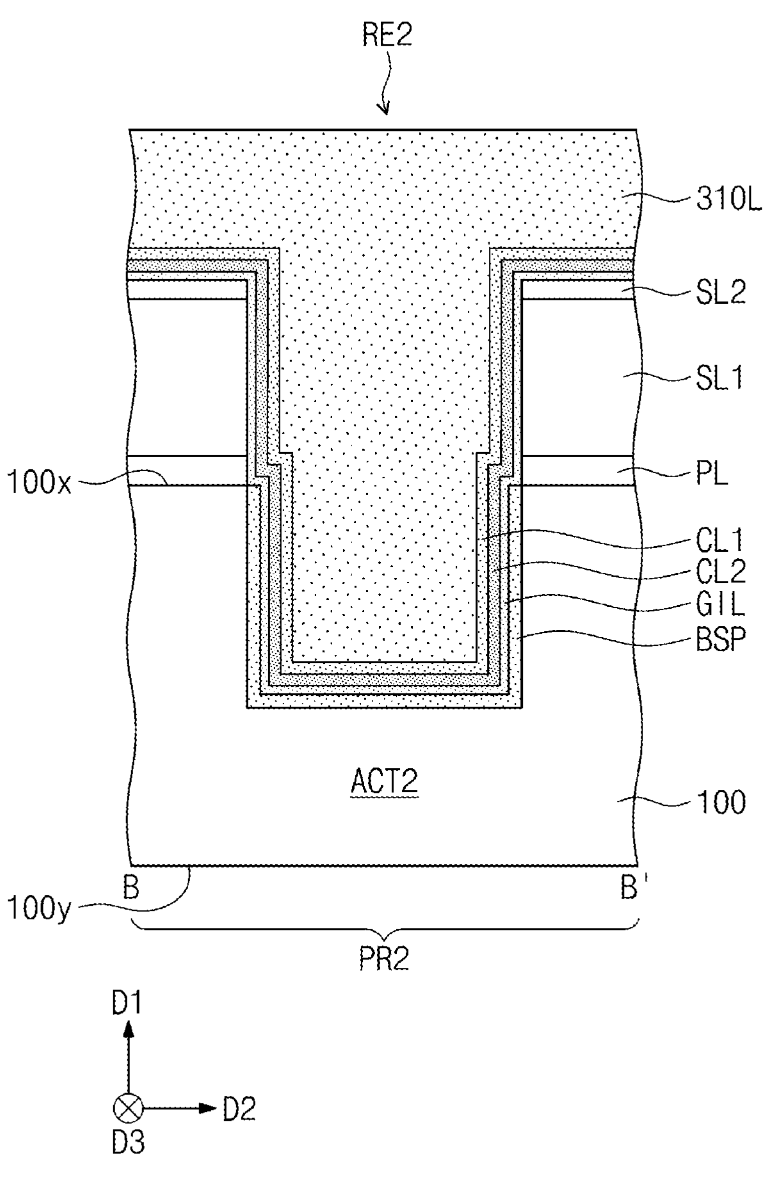

Referring to FIGS. 8A and 8B, a gate layer 310L may be formed to fill remaining portions of the first and second recess regions RE1 and RE2. The gate layer 310L may be extended to face the top surface of the second sacrificial layer SL2, e.g., a single (e.g., a same) gate layer 310L may completely fill both the first and second recess regions RE1 and RE2 and extend to cover the top surface of the second sacrificial layer SL2. The gate layer 310L may cover the first conductive line CL1. In an embodiment, the gate layer 310L may be formed of or include, e.g., doped or undoped polysilicon.

Figure 9A:
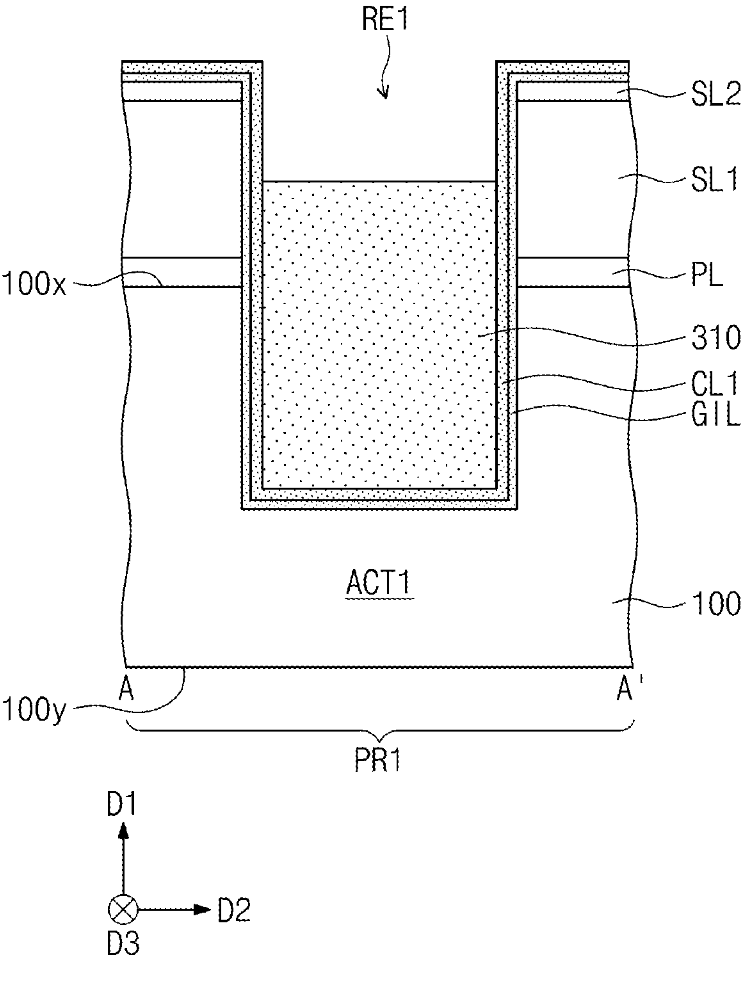
Figure 9B:
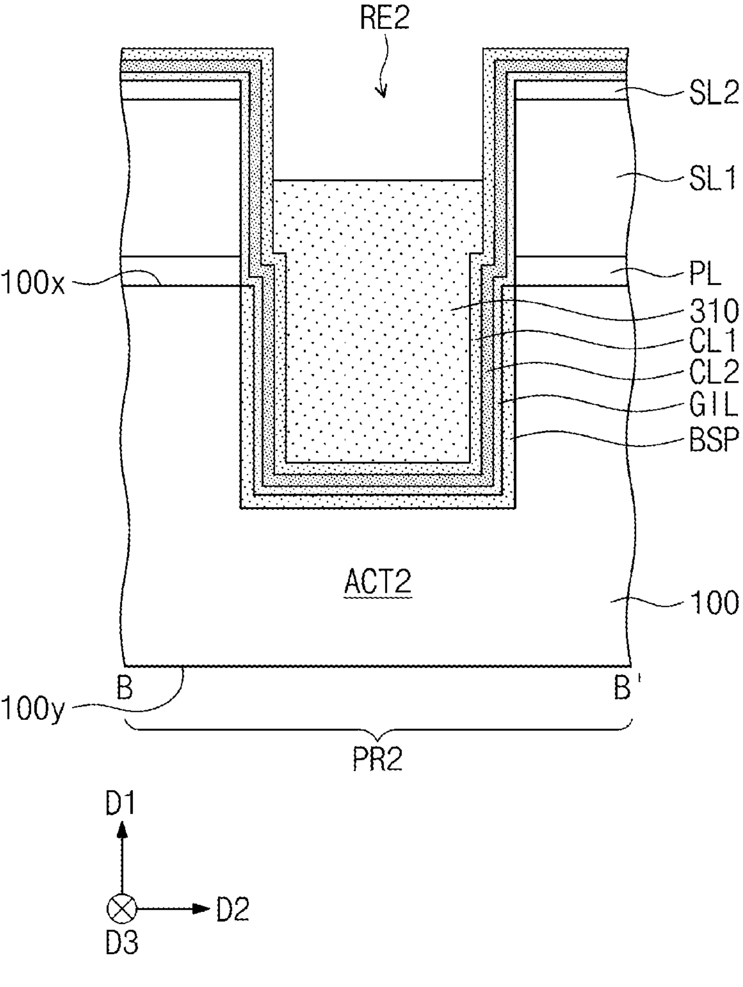

Referring to FIGS. 9A and 9B, an upper portion of the gate layer 310L may be removed, and then, the gate layer 310L may be divided into a plurality of gate patterns 310, e.g., so each of the plurality of gate patterns 310 is in a separate recess region. The removal process of the gate layer 310L may include performing an etch-back process on the gate layer 310L. The gate patterns 310 may be formed in the first and second recess regions RE1 and RE2, respectively. A top surface of the gate pattern 310 may be higher than the top surface of the substrate 100 but may be lower than the top surface of the second sacrificial layer SL2, e.g., the top surface of the gate pattern 310 may be higher than the top surface of the protection layer PL and lower than the bottom surface of the second sacrificial layer SL2. Thus, empty regions may be formed in upper portions of the first and second recess regions RE1 and RE2, and a portion of the first conductive line CL1 may be exposed.

Figure 10A:
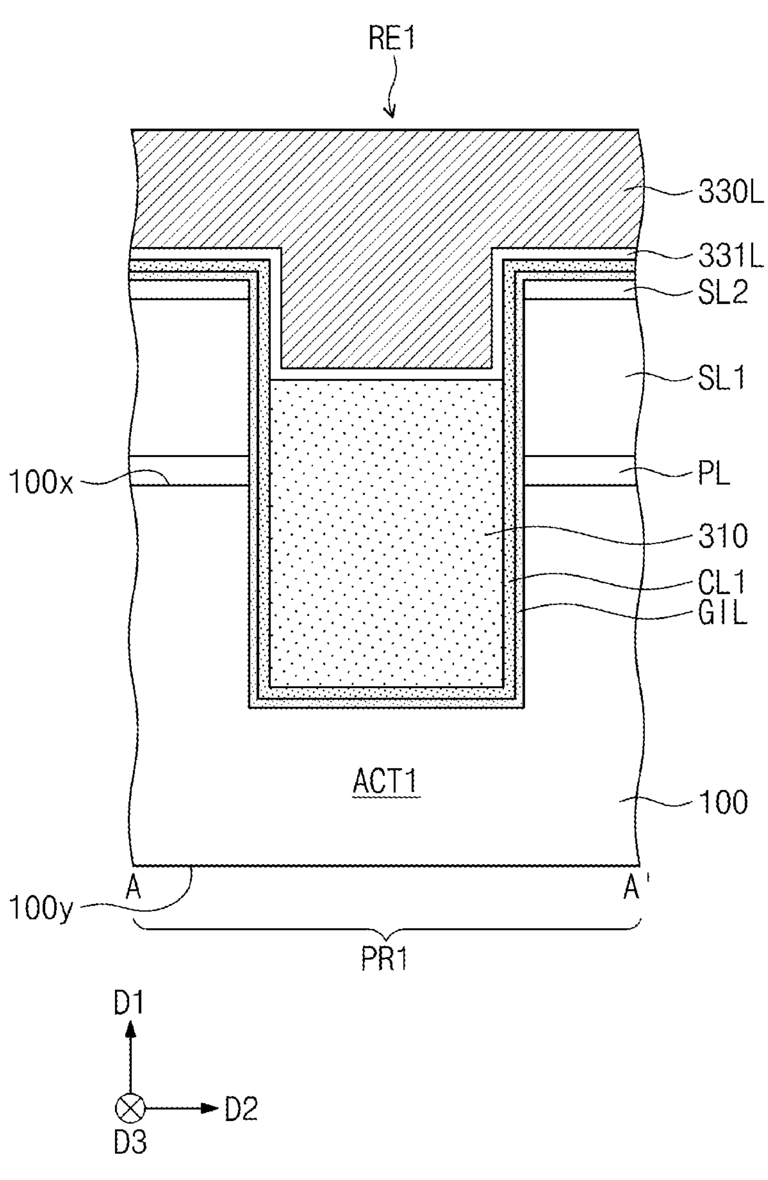
Figure 10B:
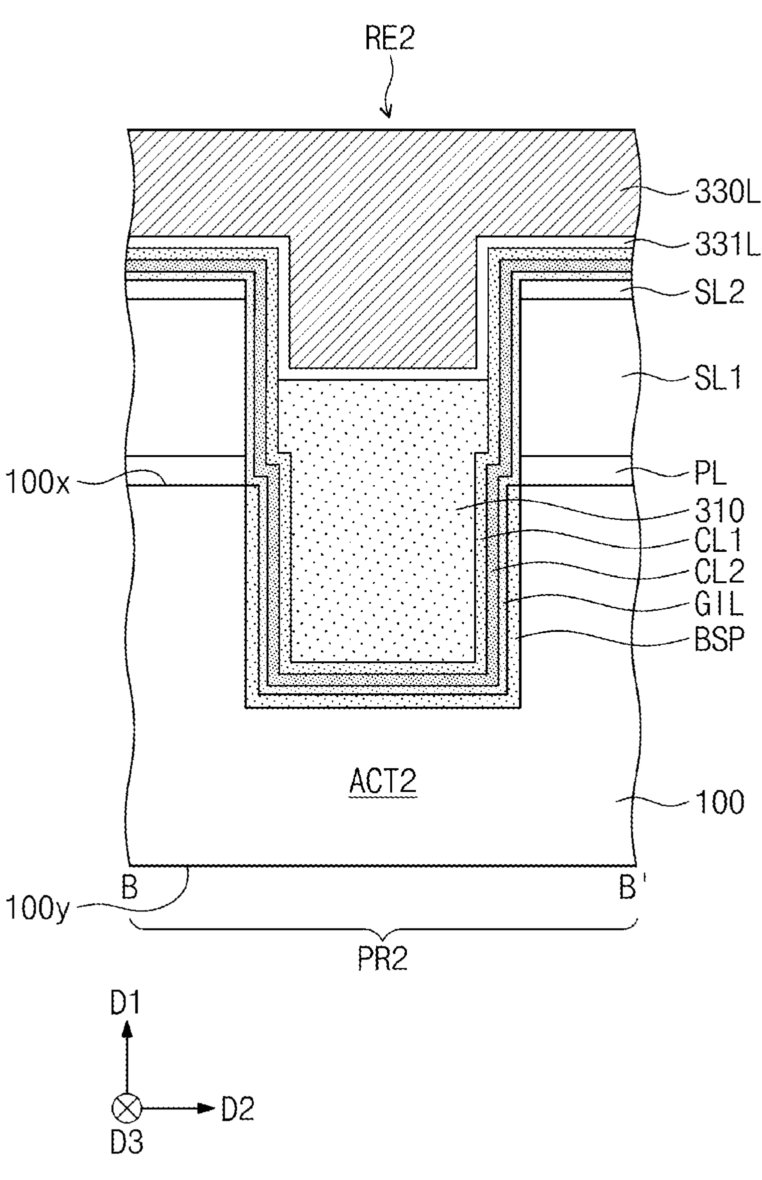

Referring to FIGS. 10A and 10B, a barrier layer 331L may be formed to conformally cover top surfaces of the gate patterns 310 and the exposed portion of the first conductive line CL1. In the first and second recess regions RE1 and RE2, the barrier layer 331L may be extended from the first conductive line CL1 in the first direction D1. In an embodiment, the barrier layer 331L may be formed of or include at least one of metal nitride materials (e.g., TiN, TSN, and TaN).

A metal-containing layer 330L may be formed to fill remaining portions of the first and second recess regions RE1 and RE2. The metal-containing layer 330L may be extended to face the top surface of the second sacrificial layer SL2 or to cover the barrier layer 331L. In an embodiment, the metal-containing layer 330L may be formed of or include at least one of metallic materials (e.g., tungsten, titanium, and tantalum). A peripheral ohmic pattern, which includes at least one of metal silicide materials, may be formed between the barrier layer 331L and the gate pattern 310.

Figure 11A:
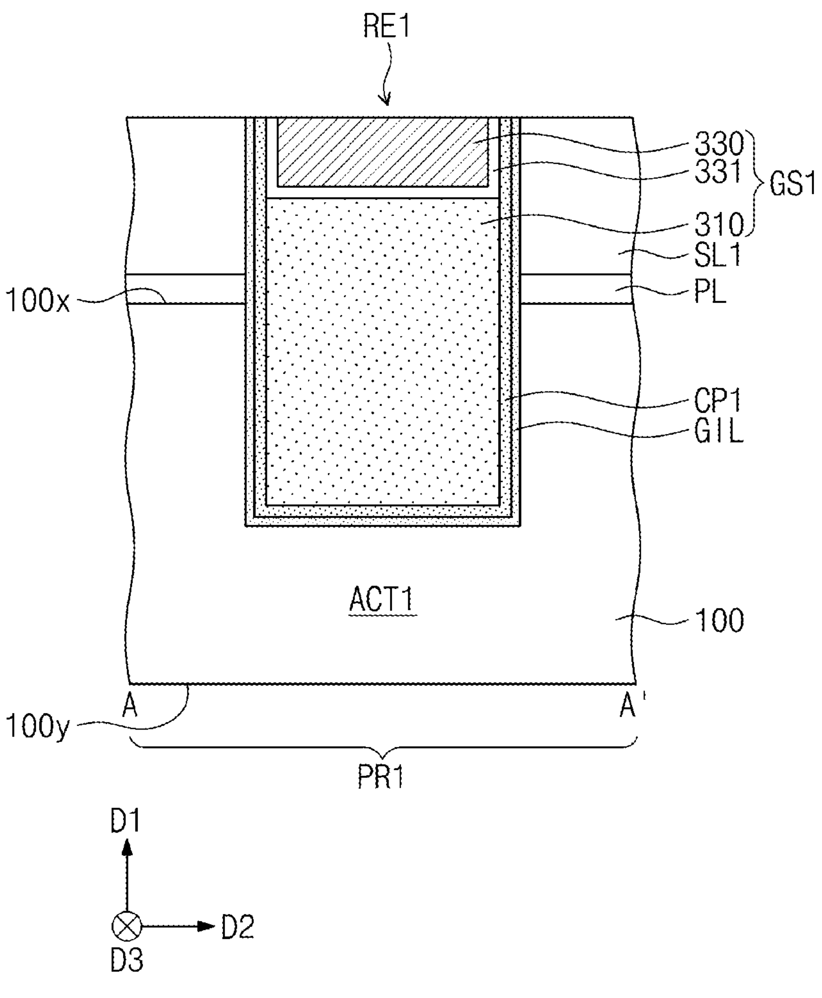
Figure 11B:
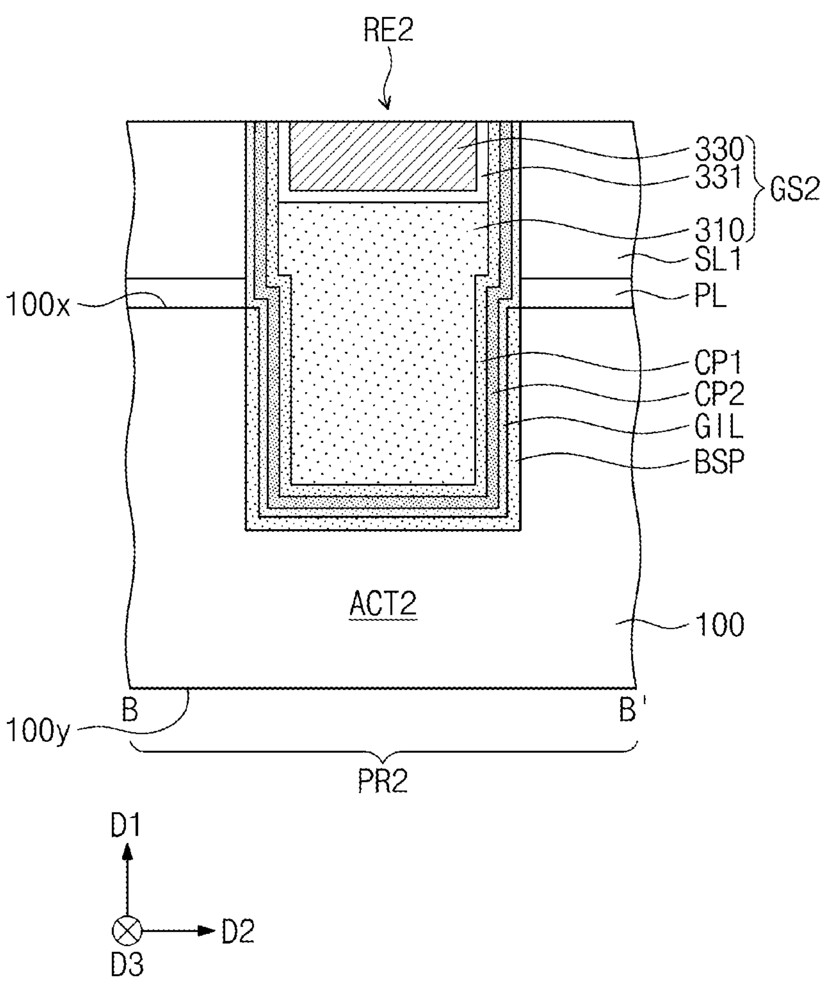

Referring to FIGS. 11A and 11B, an upper portion of the metal-containing layer 330L, an upper portion of the barrier layer 331L, an upper portion of the first conductive line CL1, an upper portion of the second conductive line CL2, an upper portion of the gate insulating layer GIL, and the second sacrificial layer SL2 may be removed. Accordingly, the metal-containing pattern 330, the barrier pattern 331, the first conductive pattern CP1, the second conductive pattern CP2, and the gate insulating pattern GI may be formed on each of the first and second peripheral regions PR1 and PR2. An upper portion of the first sacrificial layer SL1 may also be removed during this process. A top surface of the metal-containing pattern 330, a top surface of the barrier pattern 331, a top surface of the first conductive pattern CP1, a top surface of the second conductive pattern CP2, a top surface of the gate insulating pattern GI, and a top surface of the first sacrificial layer SL1 may be located at substantially the same height and may be coplanar with each other. In an embodiment, the removal process may include a planarization (e.g., CMP) process.

The first and second gate structures GS1 and GS2 may be formed on the first and second peripheral regions PR1 and PR2, respectively. Each of the first and second gate structures GS1 and GS2 may include the metal-containing pattern 330, the barrier pattern 331, and the gate pattern 310.

Referring back to FIGS. 3A and 3B, the first sacrificial layer SL1 and the protection layer PL may be removed. The removal process may include an etching process. The first and second impurity regions 110*a* and 110*b* may be formed to be adjacent to opposite side surfaces of the gate structures GS1 and GS2, and the first and second spacers SP1 and SP2 may be formed on the opposite side surfaces of the gate structures GS1 and GS2. Thereafter, the interlayer insulating layer ILD may be formed to cover the first and second spacers SP1 and SP2, and the top surface 100*x* of the substrate 100. The peripheral capping pattern PC may cover the interlayer insulating layer ILD and the gate structures GS1 and GS2.

According to an embodiment, the first and second recess regions RE1 and RE2 may be formed, before the formation of the first and second gate structures GS1 and GS2. Thereafter, a node-separation process of the first and second gate structures GS1 and GS2 may be performed by an etch-back process, not by a process including exposure and etching steps. That is, it may be possible to prevent a misalignment issue caused by an exposure process, and thus, it may be possible to improve reliability and electric characteristics of a semiconductor device.

In addition, the top surface 310*x* of the gate pattern 310 and the bottom surface 330*y* of the metal-containing pattern 330 may be substantially parallel to the bottom surface 100*y* of the substrate 100, e.g., the top surface 310*x* of the gate pattern 310 and the bottom surface 330*y* of the metal-containing pattern 330 may be completely flat in their entirety. Accordingly, it may be possible to prevent a seam from being formed in the first and second gate structures GS1 and GS2 and thereby to improve reliability and electric characteristics of a semiconductor device.

FIGS. 12A to 12D are cross-sectional views, which are respectively taken along lines A-A' to D-D' of FIG. 2 to illustrate a semiconductor device according to an embodiment. For concise description, a previously described element may be identified by the same reference number without repeating an overlapping description thereof.

Figure 12A:
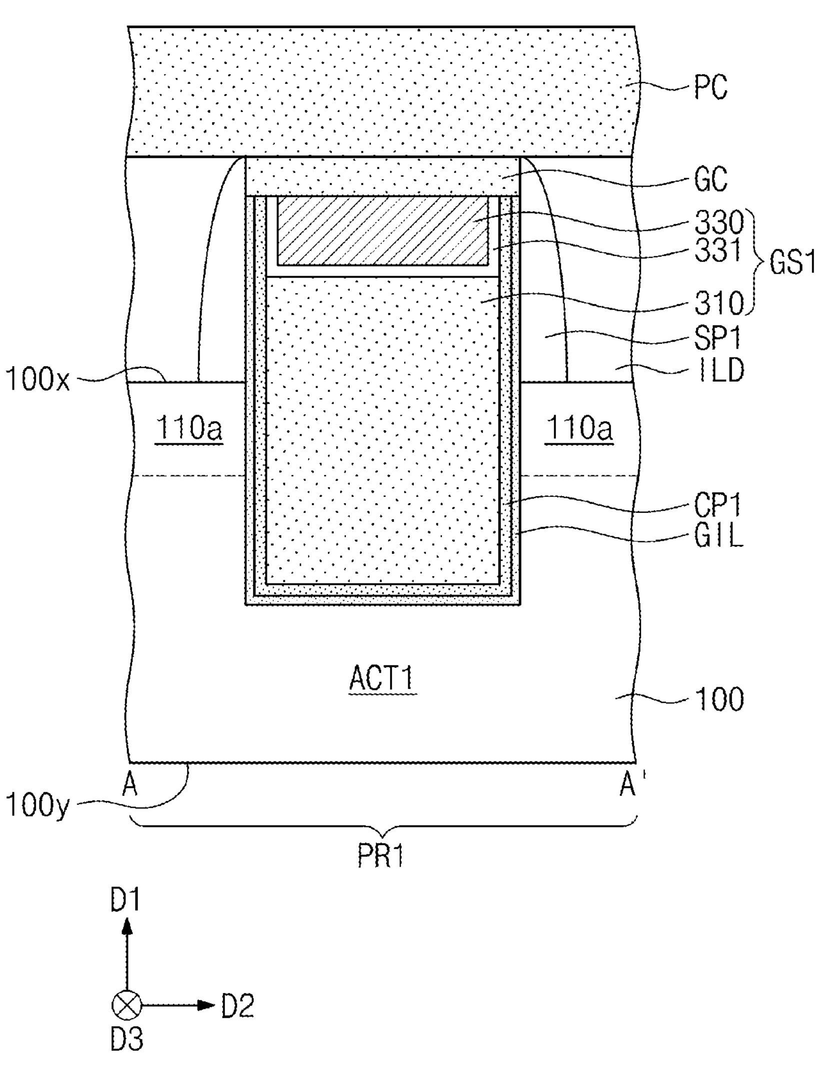
FIGS. 12A to 12D are sectional views along lines A-A' to D-D' of FIG. 2, respectively.
Figure 12B:
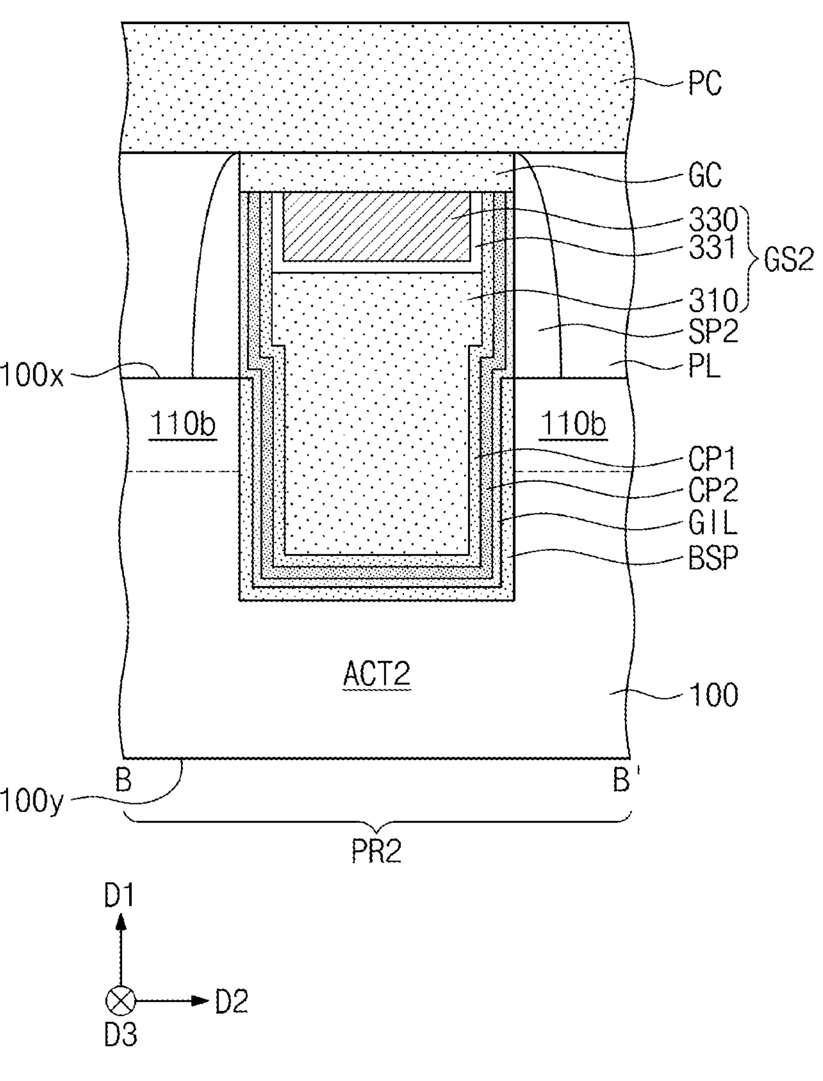
Figure 12C:
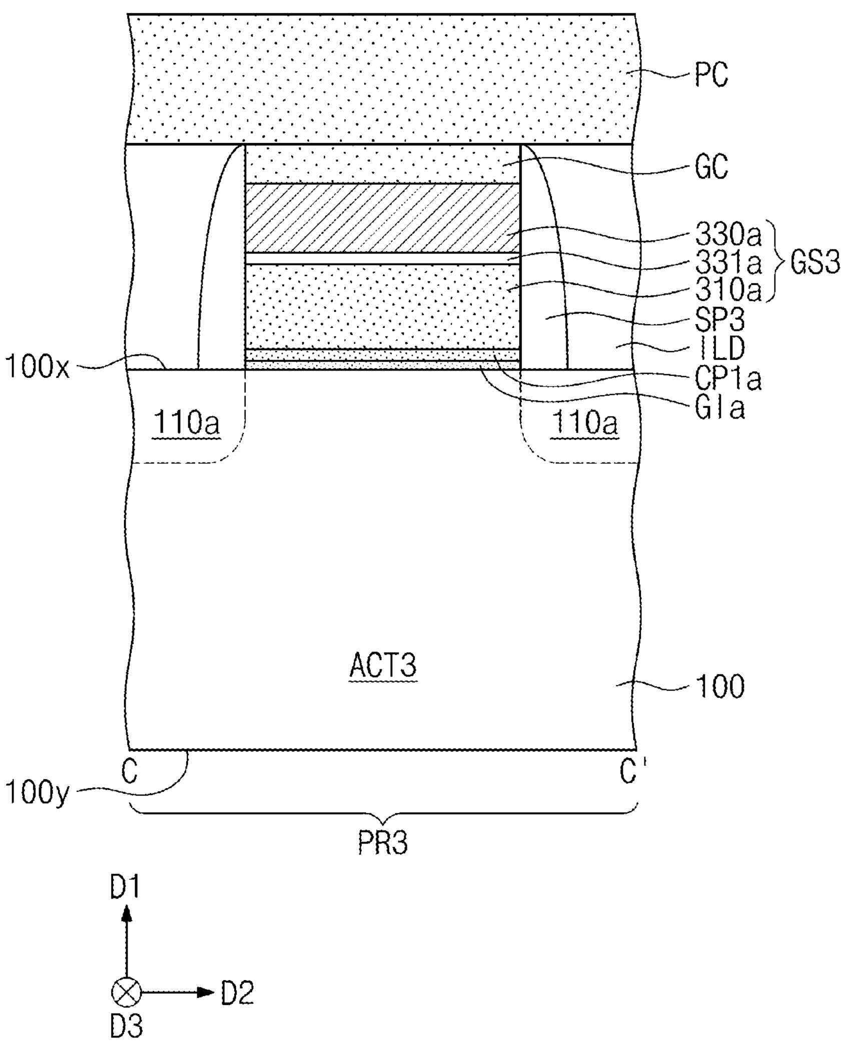
Figure 12D:
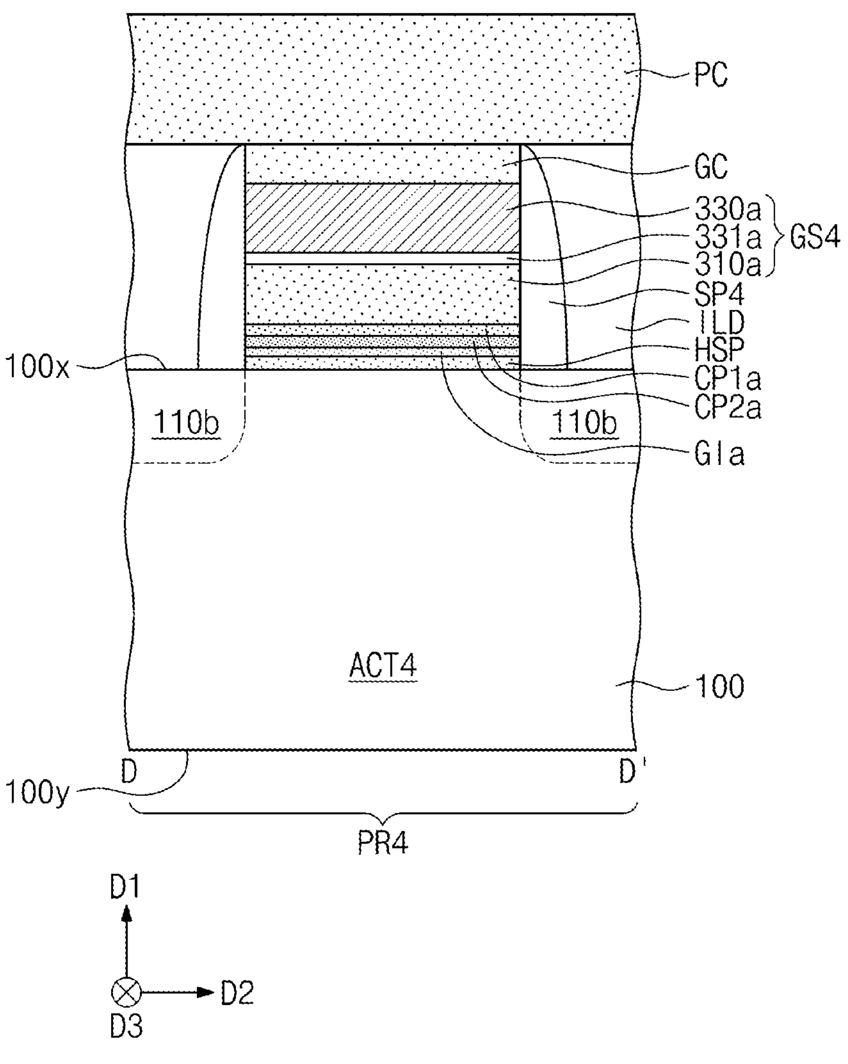

Referring to FIGS. 12A and 12D, a gate capping pattern GC may be provided on each of the gate structures GS1, GS2, GS3, and GS4. The gate capping pattern GC may cover a top surface of the metal-containing pattern 330. As shown in FIG. 12A, the gate capping pattern GC on the first gate structure GS1 may be extended to cover a top surface of the barrier pattern 331, a top surface of the first conductive pattern CP1, and a top surface of the gate insulating pattern GI. As shown in FIG. 12B, the gate capping pattern GC on the second gate structure GS2 may be extended to cover a top surface of the barrier pattern 331, a top surface of the first conductive pattern CP1, a top surface of the second conductive pattern CP2, and a top surface of the gate insulating pattern GI. In an embodiment, the gate capping pattern GC may be formed of or include, e.g., at least one of silicon nitride, or silicon oxide or combination thereof.

Each of the spacers SP1, SP2, SP3, and SP4 may be extended to face a side surface of the gate capping pattern GC, and the interlayer insulating layer ILD may be provided to cover the spacers SP1, SP2, SP3, and SP4. The peripheral capping pattern PC may be provided to cover a top surface of the gate capping pattern GC and a top surface of the interlayer insulating layer ILD.

In an embodiment, the gate capping pattern GC may be selectively provided on some of the gate structures GS1, GS2, GS3, and GS4 (e.g., on only the third and fourth gate structures GS3 and GS4). In an embodiment, the gate capping pattern GC may be provided on all of the gate structures GS1, GS2, GS3, and GS4. In an embodiment, a plurality of first gate structures GS1 may be provided, and the gate capping pattern GC may be selectively provided on some of the first gate structures GS1.

Figure 13:
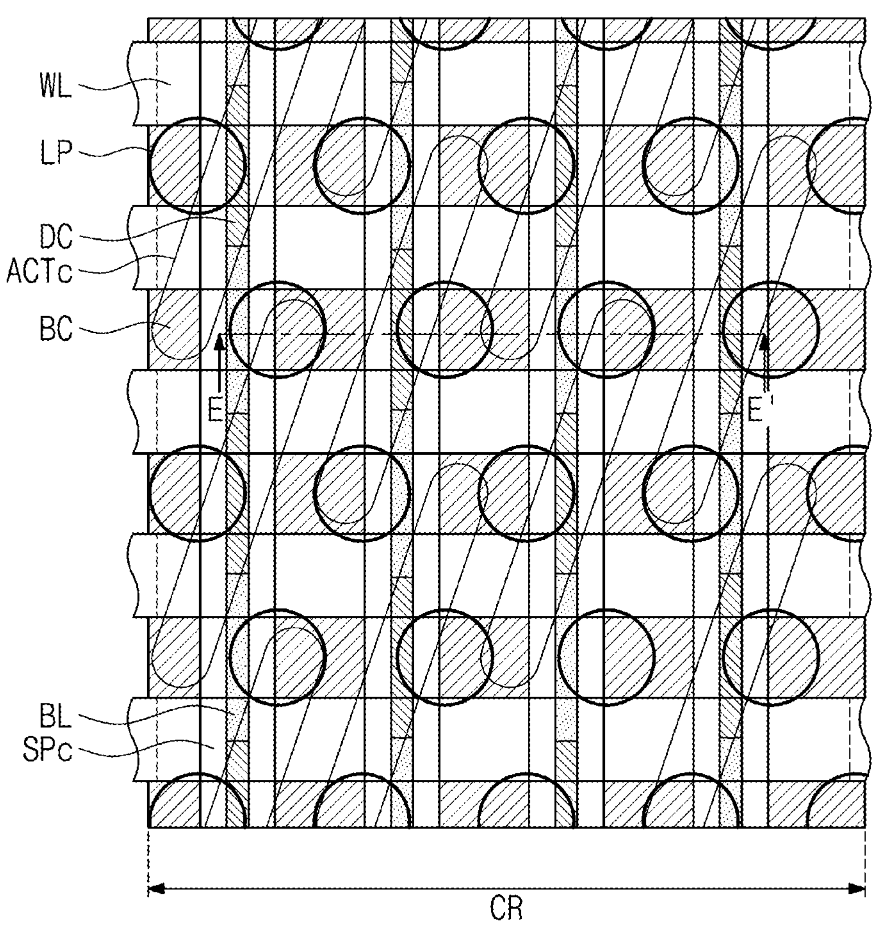
FIG. 13 is a plan view illustrating a semiconductor device according to an embodiment.
Figure 13:
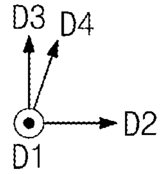
Figure 14:
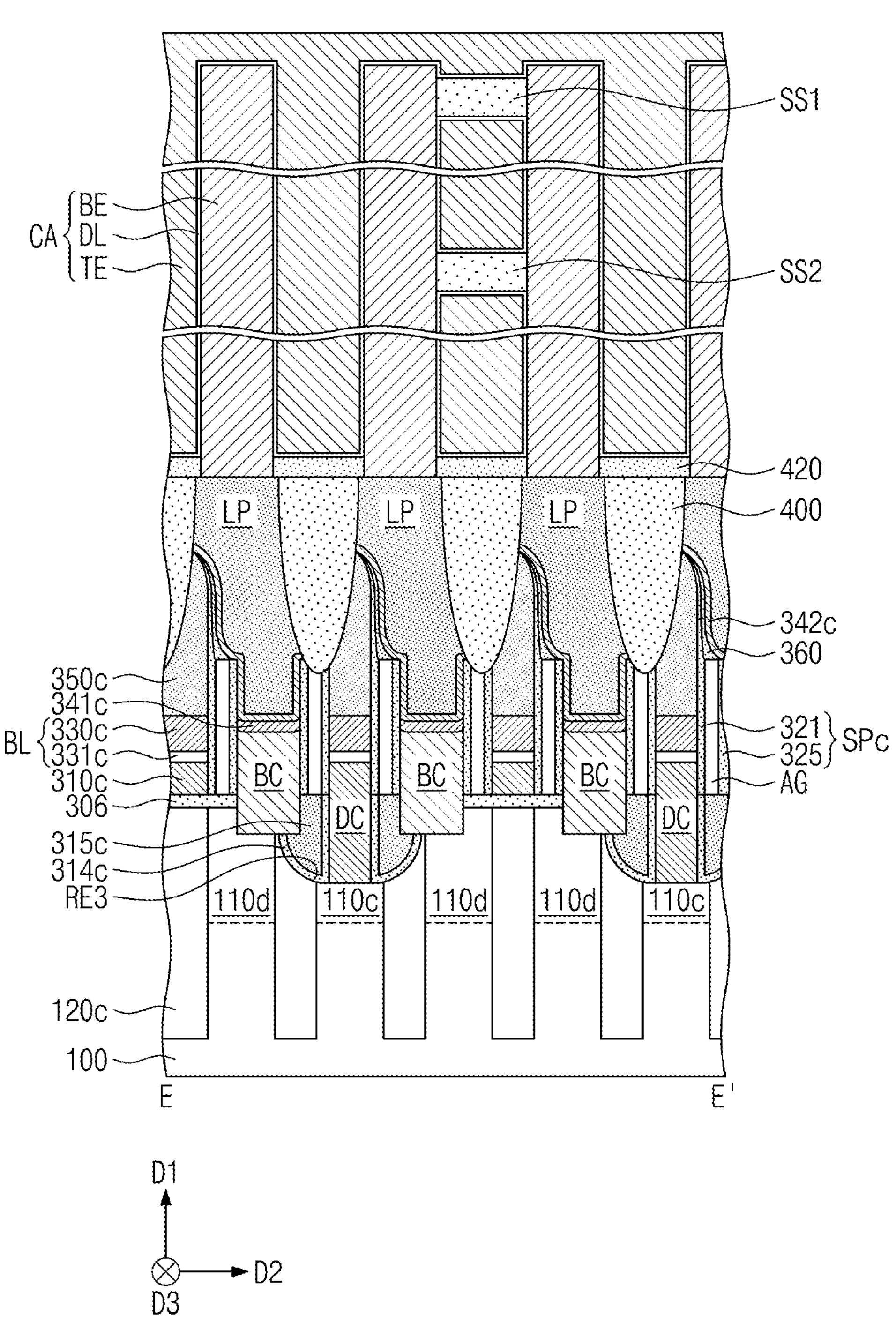
FIG. 14 is a sectional view along line E-E' of FIG. 13.

FIG. 13 is a plan view illustrating a semiconductor device according to an embodiment. FIG. 14 is a cross-sectional view, which is taken along line E-E' of FIG. 13 to illustrate a semiconductor device according to an embodiment.

Referring to FIGS. 13 and 14, the substrate 100 including a cell region CR may be provided. The cell region CR may be a region of the substrate 100, in which the cell blocks CB of FIG. 1 are provided.

Cell active patterns ACTc may be disposed on the cell region CR of the substrate 100. When viewed in a plan view, the cell active patterns ACTc may be spaced apart from each other in the second and third directions D2 and D3. The cell active patterns ACTc may be bar-shaped patterns extended in a fourth direction D4, which is parallel to a bottom surface of the substrate 100 and is not parallel to the second and third directions D2 and D3.

Cell device isolation layers 120*c* may be disposed on the cell region CR and between the cell active patterns ACTc. The cell device isolation layers 120*c* may be disposed in the substrate 100 to define the cell active patterns ACTc.

Word lines WL may be provided on the cell region CR to cross the cell active patterns ACTc and the cell device isolation layers 120*c*. The word lines WL may be disposed in grooves, which are formed in the cell active patterns ACTc and the cell device isolation layers 120*c*. The word lines WL may be extended in the second direction D2 and may be spaced apart from each other in the third direction D3. In an embodiment, the word lines WL may be buried in the substrate 100.

Third and fourth impurity regions 110*c* and 110*d* may be provided in the cell active patterns ACTc. Each of the third impurity regions 110*c* may be provided in a pair of the word lines WL, which are provided to cross each of the cell active patterns ACTc. The fourth impurity regions 110*d* may be provided in opposite edge regions of each of the cell active patterns ACTc. The third impurity regions 110*c* may contain impurities that are of the same conductivity type (e.g., n-type) as the fourth impurity regions 110*d*.

A buffer pattern 306 may be provided on the substrate 100 to cover the cell active patterns ACTc, the cell device isolation layers 120*c*, and the word lines WL. In an embodiment, the buffer pattern 306 may be formed of or include, e.g., at least one of silicon oxide, silicon nitride, or silicon oxynitride or combination thereof.

Bit lines BL may be disposed on the buffer pattern 306. The bit lines BL may be extended in the third direction D3 and may be spaced apart from each other in the second direction D2. Each of the bit lines BL may include a cell barrier pattern 331*c* and a cell metal-containing pattern 330*c* sequentially stacked. The cell barrier pattern 331*c* and the cell metal-containing pattern 330*c* may be formed of or include, e.g., the same materials as the barrier pattern 331 and the metal-containing pattern 330, respectively, of FIG. 3A.

Cell polysilicon patterns 310*c* may be interposed between the bit lines BL and the buffer pattern 306. The cell polysilicon patterns 310*c* may be formed of or include, e.g., the same material as the gate pattern 310 of FIG. 3A. A first cell ohmic pattern may be provided between the cell barrier pattern 331*c* and the cell polysilicon pattern 310*c* corresponding thereto. In an embodiment, the first cell ohmic pattern may be formed of or include, e.g., at least one of metal silicide materials.

Bit line contacts DC may be respectively interposed between the bit lines BL and the third impurity regions 110*c*. The bit lines BL may be electrically connected to the third impurity regions 110*c* through the bit line contacts DC. The bit line contacts DC may be formed of or include, e.g., doped or undoped polysilicon.

The bit line contacts DC may be disposed in a third recess region RE3. The third recess region RE3 may be provided in an upper portion of the third impurity regions 110*c* and an upper portion of the cell device isolation layers 120*c* adjacent thereto. A first gapfill insulating pattern 314*c* and a second gapfill insulating pattern 315*c* may be provided to fill a remaining portion of the third recess region RE3.

A cell capping pattern 350*c* may be provided on each of the bit lines BL and may be extended in the second direction D2. In an embodiment, the cell capping pattern 350*c* may be formed of or include, e.g., silicon nitride.

A side surface of each of the cell polysilicon patterns 310*c*, an upper side surface of each of the bit line contacts DC, a side surface of each of the bit lines BL, and a side surface of the cell capping pattern 350*c* may be covered with a bit line spacer SPc. The bit line spacer SPc may be provided on each of the bit lines BL and may be extended in the first direction D1.

The bit line spacer SPc may include a first sub-spacer 321 and a second sub-spacer 325, which are spaced apart from each other. In an embodiment, the first sub-spacer 321 and the second sub-spacer 325 may be spaced apart from each other by an air gap AG. The first sub-spacer 321 may be in contact with a side surface of each of the bit lines BL and may be extended to cover the side surface of the capping pattern 350. The second sub-spacer 325 may be provided along a side surface of the first sub-spacer 321. Each of the first and second sub-spacer 321 and 325 may be formed of or include, e.g., silicon nitride.

An upper spacer 360 may cover the side surface of the first sub-spacer 321 and may be extended to a top surface of the second sub-spacer 325. The upper spacer 360 may cover or stop the air gap AG.

Storage node contacts BC may be interposed between adjacent ones of the bit lines BL. The storage node contacts BC may be spaced apart from each other in the second and third directions D2 and D3. The storage node contacts BC may be formed of or include, e.g., doped or undoped polysilicon.

A second cell ohmic pattern 341*c* may be disposed on each of the storage node contacts BC. In an embodiment, the second cell ohmic pattern 341*c* may be formed of or include, e.g., at least one of metal silicide materials.

A cell diffusion-prevention pattern 342*c* may be provided to conformally cover the second cell ohmic pattern 341*c*, the bit line spacer SPc, and the cell capping pattern 350*c*. In an embodiment, the cell diffusion-prevention pattern 342*c* may be formed of or include at least one of metal nitride materials (e.g., TiN, TSN, and TaN). The second cell ohmic pattern 341*c* may be interposed between the cell diffusion-prevention pattern 342*c* and each of the storage node contacts BC.

Landing pads LP may be disposed on the storage node contacts BC, respectively. The landing pads LP may be spaced apart from each other in the second and third directions D2 and D3. The landing pads LP may be formed of or include at least one of metallic materials (e.g., tungsten).

A gap-fill pattern 400 may be provided to enclose each of the landing pads LP. The gap-fill pattern 400 may be interposed between adjacent ones of the landing pads LP.

Bottom electrodes BE may be disposed on the landing pads LP, respectively. The bottom electrodes BE may be formed of or include, at least one of doped polysilicon, metal nitride materials (e.g., titanium nitride), or metallic materials (e.g., tungsten, aluminum, and copper) or combination thereof. Each of the bottom electrodes BE may be shaped like, e.g., a circular pillar, a hollow cylinder, or a cup. An upper supporting pattern SS1 may be provided to support upper side surfaces of the bottom electrodes BE, and a lower supporting pattern SS2 may be provided to support lower side surfaces of the bottom electrodes BE. The upper and lower supporting patterns SS1 and SS2 may be formed of or include at least one of insulating materials (e.g., silicon nitride, silicon oxide, and silicon oxynitride).

An etch stop pattern 420 may be provided between the bottom electrodes BE and on the gap-fill pattern 400. A dielectric layer DL may be provided to cover the bottom electrodes BE and the upper and lower supporting patterns SS1 and SS2. In an embodiment, the dielectric layer DL may be formed of or include, e.g., at least one of silicon oxide, silicon nitride, silicon oxynitride, or high-k dielectric materials or combination thereof. A top electrode TE may be disposed on the dielectric layer DL to fill a space between the bottom electrodes BE. The top electrode TE may be formed of or include at least one of doped poly-silicon, doped silicon germanium, metal nitride materials (e.g., titanium nitride), or metallic materials (e.g., tungsten, aluminum, and copper) or combination thereof. The bottom electrodes BE, the dielectric layer DL, and the top electrode TE may constitute a capacitor CA.

By way of summation and review, an embodiment provides a semiconductor device with improved reliability and electrical characteristics. That is, according to an embodiment, an etch-back process may be performed for a node-separation process of separating gate structures from each other. In this case, it may be possible to prevent a misalignment issue caused by an exposure process, and thus, it may be possible to improve reliability and electric characteristics of a semiconductor device. In addition, it may be possible to prevent a seam from being formed in the gate structures, and thereby to further improve the reliability and electric characteristics of the semiconductor device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:

a substrate including an active region;

a gate structure crossing the active region, the gate structure including:

a gate pattern penetrating an upper portion of the active region in a first direction perpendicular to a bottom surface of the substrate, a metal-containing pattern on the gate pattern disposed at a first height above the bottom surface of the substrate and disposed so that in the first direction, the gate pattern is between the active region of the substrate and the metal-containing pattern, the metal-containing pattern including a bottom surface facing the gate pattern and opposite side surfaces extending from the bottom surface away from the gate pattern, a barrier pattern between the gate pattern and the metal-containing pattern, the barrier pattern formed of a nitride and extending along the opposite side surfaces of the metal-containing pattern, wherein the gate pattern is disposed both above and below a topmost surface of the active region, and a gate insulating pattern between a bottom surface of the gate pattern and the substrate, the gate insulating pattern additionally extending along opposite side surfaces of the gate pattern, and formed of a continuous material extending continuously from the bottom surface of the gate pattern to the first height to overlap the metal-containing pattern in a second direction parallel to the bottom surface of the substrate; and a pair of impurity regions disposed adjacent to opposite side surfaces of the gate structure such that the gate structure is at a height above a topmost portion of each impurity region and is at a height below a bottommost portion of each impurity region.

2. The semiconductor device as claimed in claim 1, wherein a top surface of the active region is located at a height lower than a top surface of the gate pattern and higher than the bottom surface of the gate pattern.

3. The semiconductor device as claimed in claim 1, wherein a top surface of the metal-containing pattern is coplanar with a topmost surface of the barrier pattern.

4. The semiconductor device as claimed in claim 1, wherein, when measured in the second direction, a width of the gate pattern along a top surface of the gate pattern is larger than a width of the metal-containing pattern along the bottom surface of the metal-containing pattern.

5. The semiconductor device as claimed in claim 1, wherein the gate insulating pattern includes a high-k dielectric material.

6. The semiconductor device as claimed in claim 1, wherein the gate insulating pattern straightly extends in the first direction from an inner portion of the active region to a height higher than the topmost surface of the active region to have the same thickness above the topmost surface of the active region as below the topmost surface of the active region, in the second direction.

7. The semiconductor device as claimed in claim 1, wherein the gate insulating pattern additionally extends to face opposite side surfaces of the barrier pattern.

8. The semiconductor device as claimed in claim 7, wherein the barrier pattern is between the gate insulating pattern and each of the opposite side surfaces of the metal-containing pattern.

9. The semiconductor device as claimed in claim 1, wherein a topmost surface of the gate insulating pattern is at substantially the same height as a top surface of the metal-containing pattern.

10. The semiconductor device as claimed in claim 1, further comprising a buried semiconductor pattern between the gate insulating pattern and the substrate.

11. The semiconductor device as claimed in claim 10, wherein each of opposite side surfaces of the buried semiconductor pattern in the active region is coplanar with a corresponding one of opposite side surfaces of the gate insulating pattern located at a level higher than a top surface of the active region.

12. The semiconductor device as claimed in claim 1, further comprising a conductive pattern between the gate structure and the gate insulating pattern, the conductive pattern including a single layer or multiple layers.

13. The semiconductor device as claimed in claim 12, wherein the conductive pattern covers the opposite side surfaces of the metal-containing pattern.

14. A semiconductor device, comprising:

a substrate including active regions;

a first gate structure and a second gate structure crossing the active regions, respectively, each of the first gate structure and the second gate structure including:

a gate pattern penetrating an upper portion of a corresponding active region, a metal-containing pattern on the gate pattern, so that each gate pattern is between a respective active region and a respective metal-containing pattern in a first direction perpendicular to a bottom surface of the substrate, and a barrier pattern between the gate pattern and the metal-containing pattern in the first direction, wherein for each metal-containing pattern, the barrier pattern additionally extends along opposite side surfaces of the metal-containing pattern;

a buried semiconductor pattern between the substrate and the second gate structure, wherein each gate pattern is disposed both above and below a topmost surface of the active regions;

a first gate insulating pattern between the first gate structure and the substrate and additionally extending along opposite side surfaces of the gate pattern of the first gate structure and along side surfaces of the metal-containing pattern of the first gate structure, wherein the first gate insulating pattern is disposed to overlap each of a respective active region and a respective metal-containing pattern in a second direction parallel to the bottom surface of the substrate, and has the same thickness in the second direction where it overlaps the respective active region as where it overlaps the respective metal-containing pattern; and for each of the first gate structure and the second gate structure, a pair of impurity regions disposed adjacent to opposite side surfaces of the gate structure, such that each gate structure is at a height above a topmost portion of each impurity region and is at a height below a bottommost portion of each impurity region.

15. The semiconductor device as claimed in claim 14, further comprising:

a second gate insulating pattern between the second gate structure and the buried semiconductor pattern, the second gate insulating pattern extending along opposite side surfaces of the second gate structure.

16. The semiconductor device as claimed in claim 15, further comprising:

a first conductive pattern between the first gate structure and the first gate insulating pattern, and between the second gate structure and the second gate insulating pattern; and a second conductive pattern between the first conductive pattern and the second gate insulating pattern.

17. The semiconductor device as claimed in claim 14, further comprising:

a metal-containing conductive pattern formed conformally on the first gate insulating pattern, extending along the opposite side surfaces of the gate pattern, and formed of a continuous material extending continuously along the first gate insulating pattern from the bottom surface of the gate pattern to a height at which the metal-containing pattern is disposed.

18. A semiconductor device, comprising:

a substrate including active regions;

a first gate structure and a second gate structure crossing the active regions, respectively, wherein:

the first gate structure includes:

a gate pattern penetrating an upper portion of a first active region of the active regions, a metal-containing pattern on the gate pattern so that the gate pattern is between the metal-containing pattern and the substrate, and a barrier pattern between the gate pattern and the metal-containing pattern, the barrier pattern extending along opposite side surfaces of the metal-containing pattern, and the second gate structure includes a horizontal gate pattern, a horizontal barrier pattern, and a horizontal metal-containing pattern, which are sequentially stacked on a top surface of another of the active regions such that none of the horizontal gate pattern, the horizontal barrier pattern, or the horizontal metal-containing pattern penetrates the active regions, and does not include a gate pattern penetrating an upper portion of any of the active regions, wherein each gate pattern of the first gate structure is disposed both above and below a topmost surface of the active regions; and a pair of impurity regions disposed adjacent to opposite side surfaces of the first gate structure such that the first gate structure is at a height above a topmost portion of each impurity region and is at a height below a bottommost portion of each impurity region.

19. The semiconductor device as claimed in claim 18, wherein a bottom surface of the second gate structure is at a height higher than a bottom surface of the first gate structure.

20. The semiconductor device as claimed in claim 18, wherein:

the metal-containing pattern is disposed so that in a vertical direction, the gate pattern is between the first active region and the metal-containing pattern, the metal-containing pattern including a bottom surface facing the gate pattern and opposite side surfaces extending from the bottom surface away from the gate pattern, and wherein the barrier pattern is formed of a nitride.

* * * * *